(12) United States Patent
Asayama et al.

(10) Patent No.: US 9,853,410 B2
(45) Date of Patent: Dec. 26, 2017

(54) GAS LASER DEVICE AND CONTROL METHOD THEREFOR

(71) Applicant: Gigaphoton Inc., Tochigi (JP)

(72) Inventors: Takeshi Asayama, Oyama (JP); Hiroaki Tsushima, Oyama (JP); Kouji Kakizaki, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/240,162

(22) Filed: Aug. 18, 2016

(65) Prior Publication Data

US 2016/0359291 A1   Dec. 8, 2016

Related U.S. Application Data

(63) Continuation of application No. PCT/JP2014/057375, filed on Mar. 18, 2014.

(51) Int. Cl.

| H01S 3/038 | (2006.01) |
| H01S 3/036 | (2006.01) |
| H01S 3/225 | (2006.01) |
| H01S 3/00 | (2006.01) |
| G03F 7/20 | (2006.01) |
| H01S 3/08 | (2006.01) |
| H01S 3/097 | (2006.01) |
| H01S 3/0971 | (2006.01) |
| H01S 3/134 | (2006.01) |
| H01S 3/13 | (2006.01) |

(52) U.S. Cl.
CPC .......... *H01S 3/038* (2013.01); *G03F 7/70025* (2013.01); *H01S 3/0014* (2013.01); *H01S 3/036* (2013.01); *H01S 3/225* (2013.01); *H01S 3/08009* (2013.01); *H01S 3/0971* (2013.01); *H01S 3/09705* (2013.01); *H01S 3/134* (2013.01); *H01S 3/1305* (2013.01)

(58) Field of Classification Search
CPC ........ H01S 3/038; H01S 3/0014; H01S 3/225; H01S 3/036; H01S 3/08009; H01S 3/09705; H01S 3/0971
See application file for complete search history.

(56) References Cited

U.S. PATENT DOCUMENTS

| 7,154,922 B2 | 12/2006 | Hattori |
| 2008/0198891 A1 | 8/2008 | Hori et al. |
| 2008/0315126 A1 | 12/2008 | Toki |

(Continued)

FOREIGN PATENT DOCUMENTS

| JP | 03-052281 A | 3/1991 |
| JP | 06-029592 A | 2/1994 |

(Continued)

OTHER PUBLICATIONS

International Search Report issued in PCT/JP2014/057375; dated Jun. 24, 2014.

*Primary Examiner* — Dung Nguyen
(74) *Attorney, Agent, or Firm* — Studebaker & Brackett PC

(57) ABSTRACT

A gas laser apparatus includes a chamber containing a laser gas, a pair of electrodes disposed within the chamber, a fan disposed within the chamber, a motor connected to a rotating shaft of the fan, and a rotating speed control unit configured to control a rotating speed of the fan based on a wear-out parameter of the pair of electrodes.

14 Claims, 30 Drawing Sheets

(56) References Cited

U.S. PATENT DOCUMENTS

2015/0139258 A1    5/2015  Tsushima et al.
2015/0194781 A1*   7/2015  Asayama ............... H01S 3/225
                                                       372/38.05

FOREIGN PATENT DOCUMENTS

| JP | 2002-026430 A | 1/2002 |
| JP | 2006-114689 A | 4/2006 |
| JP | 2008-198919   | 8/2008 |
| JP | 2008-235646 A | 10/2008 |
| JP | 5393730 B  * | 10/2013 |
| WO | 2007/066700 A1 | 6/2007 |
| WO | 2008/130474 A1 | 10/2008 |
| WO | 2014/017562 A1 | 1/2014 |
| WO | 2014/046186 A1 | 3/2014 |

* cited by examiner

GAS LASER DEVICE AND CONTROL METHOD THEREFOR

TECHNICAL FIELD

The present disclosure relates to a gas laser apparatus and a method for controlling the same.

BACKGROUND ART

The recent miniaturization and increased levels of integration of semiconductor integrated circuits has led to a demand for increases in the resolutions of semiconductor exposure devices (called "exposure devices" hereinafter). Accordingly, advances are being made in the reduction of the wavelengths of light emitted from exposure light sources. Typically, gas laser apparatuses are being used as exposure light sources instead of conventional mercury lamps. For example, a KrF excimer laser apparatus that outputs an ultraviolet laser beam at a wavelength of 248 nm and an ArF excimer laser apparatus that outputs an ultraviolet laser beam at a wavelength of 193 nm are used as gas laser apparatuses for exposure.

SUMMARY

A gas laser apparatus according to a first aspect of the present disclosure may include: a chamber containing a laser gas; a pair of electrodes disposed within the chamber; a fan disposed within the chamber; a motor connected to a rotating shaft of the fan; and a rotating speed control unit configured to control rotating speed of the fan based on a wear-out parameter of the pair of electrodes.

A gas laser apparatus according to a second aspect of the present disclosure may include: a chamber containing a laser gas; a pair of electrodes disposed within the chamber; a fan disposed within the chamber; a motor connected to a rotating shaft of the fan; an electrode moving mechanism configured to move a first one of the pair of electrodes toward a second one of the pair of electrodes; and a rotating speed control unit configured to control rotating speed of the fan based on a moving distance of the first electrode moved by the electrode moving mechanism.

A method according to a third aspect of the present disclosure may be a method for controlling a gas laser apparatus, the gas laser apparatus including a chamber containing a laser gas, a pair of electrodes disposed within the chamber, a fan disposed within the chamber, and a motor connected to a rotating shaft of the fan, the method including: calculating a distance between the pair of electrodes based on a wear-out parameter of the pair of electrodes; and controlling rotating speed of the fan based on the distance between the pair of electrodes.

BRIEF DESCRIPTION OF DRAWINGS

Exemplary embodiments of the present disclosure will be described hereinafter with reference to the appended drawings.

DESCRIPTION OF EMBODIMENTS

Figure 1:
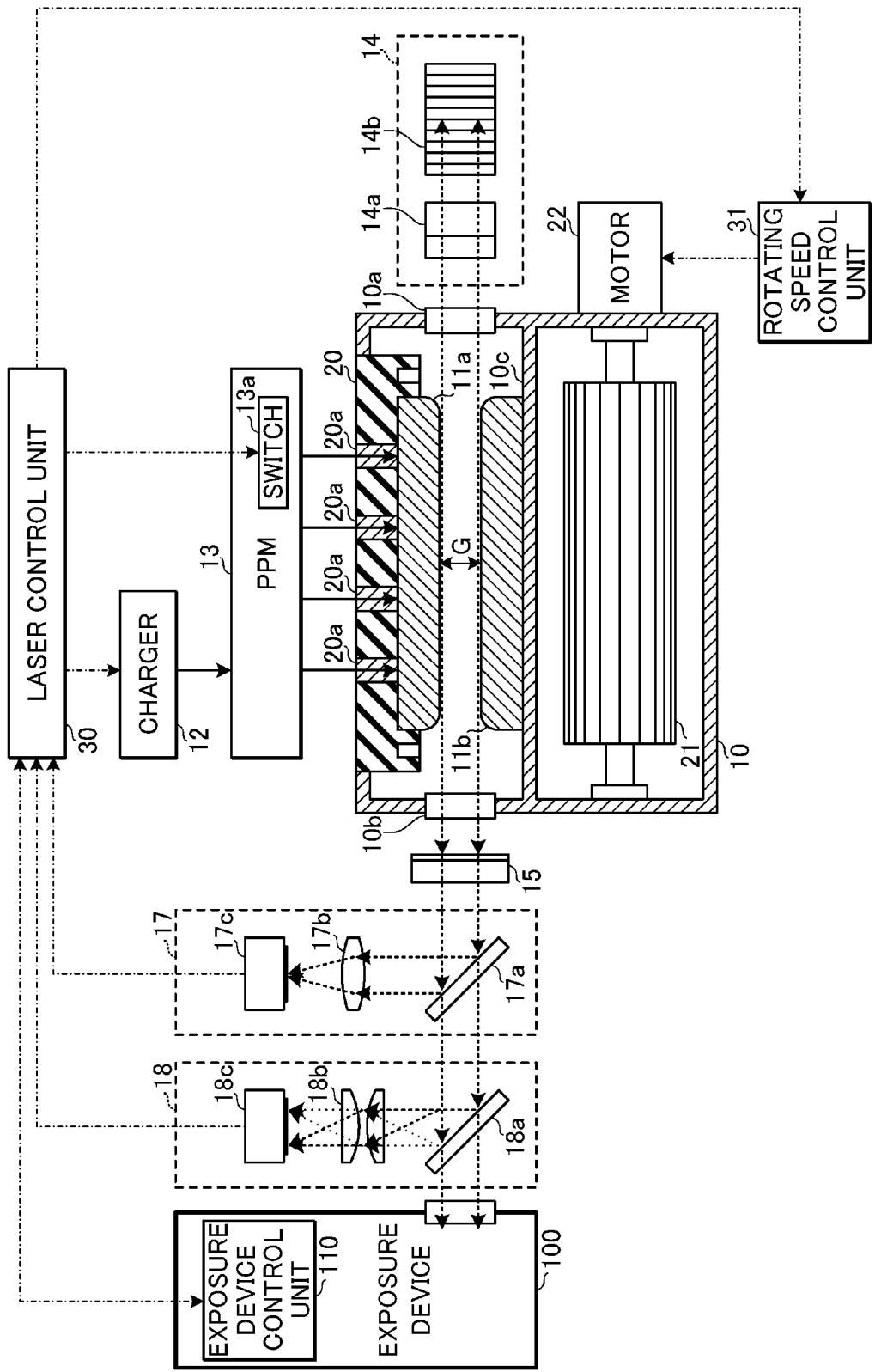
FIG. 1 schematically illustrates a configuration of an excimer laser apparatus according to a first embodiment.

Contents
1. Outline
2. Configuration of Excimer Laser Apparatus (First Embodiment)
   2.1 Laser Chamber
   2.2 Optical Resonator
   2.3 Various Types of Sensors
   2.4 Laser Control Unit
   2.5 Heat Exchanger
   2.6 Configuration of Pulse Power Module
   2.7 Increase in Width of Discharge Region due to Wearing out of Electrodes
3. Control of Rotating Speed of Fan
   3.1 First Example of Control
   3.2 Second Example of Control
   3.3 Third Example of Control
   3.4 Fourth Example of Control
   3.5 Fifth Example of Control
4. Excimer Laser Apparatus Including Electrode Moving Mechanisms (Second Embodiment)
   4.1 Configuration
   4.2 Sixth Example of Control
   4.3 Seventh Example of Control
   4.4 Eighth Example of Control
   4.5 Ninth Example of Control
5. Excimer Laser Apparatus Including Electrode Moving Mechanisms (Third Embodiment)
6. Excimer Laser Apparatus Including Gas Supply and Exhaust Devices (Fourth Embodiment)
   6.1 Configuration
   6.2 Control of Pulse Energy by Charging Voltage
   6.3 Control of Gas Pressure
   6.4 Tenth Example of Control
7. Regarding the Influence of Acoustic Waves
8. Configuration of Controller Embodiments of the present disclosure will be described in detail hereinafter with reference to the drawings. The embodiments described hereinafter indicate several examples of the present disclosure, and are not intended to limit the content of the present disclosure. Furthermore, not all of the configurations and operations described in the embodiments are required configurations and operations in the present disclosure. Note that identical constituent elements will be given identical reference numerals, and redundant descriptions thereof will be omitted.

1. Outline

In an excimer laser apparatus for an exposure device, a pair of electrodes may be disposed within a chamber. A laser gas may be contained within the chamber, and the laser gas may be circulated by a fan within the chamber. The excimer laser apparatus may apply a high voltage to the pair of electrodes for discharge and thereby pump the laser gas for laser oscillation.

However, repetition of discharge in the excimer laser apparatus may cause a surface of the pair of electrodes to wear out according to the number of times discharge occurs and may thus increase the distance between the pair of electrodes. An increase in the distance between the pair of electrodes may lead to a change in electric field distribution and by extension, to an increase in width of discharge region. Assuming that a rotating speed of the fan is constant, the increase in width of discharge region may lead to a decrease in a CR value. The CR value may be defined by the following equation:

$$CR = vt/W,$$

where v may be the flow rate of the laser gas between the pair of electrodes, t may be the interval between occurrences of discharge, and W may be the width of discharge region. The width of discharge region may be the length of a discharge region along the direction of flow of the laser gas which is formed between the pair of electrodes.

A decrease in the aforementioned CR value may cause the next discharge to start before a substance generated by the previous discharge is fully exhausted from the discharge region. This may lead to destabilization of the discharge and, by extension, to lower energy stability.

It may therefore be conceivable to prevent the destabilization of the discharge by increasing the rotating speed of the fan in advance before the pair of electrodes wear out. However, increasing the rotating speed of the fan before the pair of electrodes wear out may cause the fan to consume more electric power than necessary.

According to one aspect of the present disclosure, the rotating speed of the fan may be controlled on the basis of a wear-out parameter of the pair of electrodes. Further, a moving mechanism configured to move the pair of electrodes toward each other may be provided so that the rotating speed of the fan may be controlled on the basis of an amount of movement made by the moving mechanism.

2. Configuration of Excimer Laser Apparatus (First Embodiment)

FIG. 1 schematically illustrates a configuration of an excimer laser apparatus according to a first embodiment. As shown in FIG. 1, the excimer laser apparatus may include a laser chamber 10, a pair of electrodes 11a and 11b, a charger 12, and a pulse power module (PPM) 13. FIG. 1 illustrates an internal configuration of the laser chamber 10 as viewed from a direction substantially perpendicular to the direction that a laser beam travels.

The excimer laser apparatus may further include a cross flow fan 21, a motor 22, and a rotating speed control unit 31. In the present disclosure, the cross flow fan 21 may be simply referred to as a "fan". The excimer laser apparatus may further include a line narrow module 14, an output coupling mirror 15, a pulse energy measurement unit 17, a beam profile measurement unit 18, and a laser control unit 30. The beam profile measurement unit 18 may constitute the distance measurement unit of the present disclosure. As shown in FIG. 1, the excimer laser apparatus may be connected to an exposure device 100 configured to perform exposure using a laser beam that is outputted from the excimer laser apparatus.

2.1 Laser Chamber

The laser chamber 10 may be a chamber containing a laser gas serving as a laser medium, which contains, for example, argon, neon, fluorine, and the like. The pair of electrodes 11a and 11b may be disposed within the laser chamber 10 as electrodes for pumping the laser medium through discharge. The laser chamber 10 may have an opening formed therein, and the opening may be closed by an electric insulator 20. The electrode 11a may be supported by the electric insulator 20, and the electrode 11b may be supported by an internal dividing plate 10c of the laser chamber 10. The electric insulator 20 may have electric conductors 20a embedded therein. The electric conductors 20a may be configured to apply, to the electrode 11a, a high voltage that is supplied from the pulse power module 13.

The cross flow fan 21 may have its rotating shaft connected to the motor 22, which is disposed outside the laser chamber 10. Rotation of the cross flow fan 21 by the motor 22 may cause the laser gas to circulate in the laser chamber 10. The rotating speed control unit 31 may control the speed of rotation of the cross flow fan 21 by controlling the rotating speed or torque of the motor 22. In a case where the motor 22 is an AC motor, the rotating speed control unit 31 may include an AC power supply and an inverter. The inverter may be capable of changing the frequency of an alternating current that is supplied from the AC power supply to the motor 22. In a case where the motor 22 is a DC motor, the rotating speed control unit 31 may be a power supply device that is capable of changing a DC voltage that is supplied to the motor 22.

The charger 12 may be configured of, for example, a capacitor connected to a power source device, and may hold electrical energy for applying a high voltage between the pair of electrodes 11a and 11b. The pulse power module 13 may include a switch 13a that is controlled by the laser control unit 30. When the switch 13a changes from OFF to ON, the pulse power module 13 may generate a pulse-form high voltage with the electrical energy held in the charger 12, and may apply that high voltage between the pair of electrodes 11a and 11b.

When the high voltage is applied between the pair of electrodes 11a and 11b, discharge may occur between the pair of electrodes 11a and 11b. The laser medium within the laser chamber 10 may be excited by the energy of the discharge and may shift to a high-energy level. When the excited laser medium shifts back to a low-energy level, light depending on the difference between the energy levels may be emitted.

Windows 10a and 10b may be provided at both ends of the laser chamber 10. The light produced within the laser chamber 10 may be emitted to the exterior of the laser chamber 10 via the windows 10a and 10b.

2.2 Optical Resonator

The line narrow module 14 may include a prism 14a and a grating 14b. The prism 14a may expand the beam width of the light emitted via the window 10a of the laser chamber 10, and may allow that light to pass through to the grating 14b. In addition, the prism 14a may reduce the beam width of light reflected from the grating 14b, and may allow that light to pass through to the laser chamber 10. In addition, the prism 14a may, when allowing light to pass therethrough, refract the light to a different angle according to the wavelength of the light. Accordingly, the prism 14a may function as a wavelength dispersion element.

The grating 14b is configured of a highly-reflective material, and many grooves may be formed in the surface thereof at predetermined intervals. Each groove, for example, may be a triangular groove. The light that enters into the grating 14b from the prism 14a may be reflected in multiple directions that are vertical relative to the directions of the respective grooves (the vertical direction, in FIG. 1) at the sloped surfaces of those respective grooves. When the reflected light reflected at a given groove overlaps with the reflected light reflected at another given groove, the difference in the optical path lengths between those instances of reflected light depends on the angle of reflection of those instances of reflected light. When the light is of a wavelength that corresponds to the difference in the optical path lengths, the phases of the instances of reflected light may match and reinforce each other, whereas when the light is of a wavelength that does not correspond to the optical path length, the phases of the instances of reflected light do not match and may weaken each other. Due to this interference effect, light in the vicinity of a specific wavelength based on the angle of reflection may be extracted, and light that contains a large amount of that light of the specific wavelength may be returned to the laser chamber 10 via the prism 14a. Therefore, the grating 14b may function as a wavelength dispersion element.

In this manner, the line narrow module 14, which reduces the spectral width of a laser beam, may be configured by the prism 14a and the grating 14b.

The surface of the output coupling mirror 15 may be coated with a partially-reflective film. Accordingly, the output coupling mirror 15 may allow some of the light outputted via the window 10b of the laser chamber 10 to pass through, thus outputting that light, and may reflect the remainder of the light to return the reflected light to the interior of the laser chamber 10.

The distance between the output coupling mirror 15 and the grating 14b may be set to a distance at which light of the particular wavelength selected by the line narrow module 14 forms a standing wave. Accordingly, an optical resonator may be configured from the line narrow module 14 and the output coupling mirror 15. The light emitted from the laser chamber 10 may travel back and forth between the line narrow module 14 and the output coupling mirror 15, and may be amplified each time it passes a laser gain space between the electrode 11a and the electrode 11b within the laser chamber 10. Some of the amplified light may then be outputted as a laser beam via the output coupling mirror 15.

2.3 Various Types of Sensors

The pulse energy measurement unit 17 may include a beam splitter 17a, a focusing optical system 17b, and an optical sensor 17c. The beam splitter 17a may cause a laser beam having passed through the output coupling mirror 15 to be transmitted at high transmittance toward the exposure device 100, and may reflect a portion of the laser beam toward the focusing optical system 17b. The focusing optical system 17b may focus the light reflected by the beam splitter 17a onto a photosensitive surface of the optical sensor 17c. The optical sensor 17c may detect pulse energy of the laser beam focused on the photosensitive surface, and may output, to the laser control unit 30, data representing the detected pulse energy.

The beam profile measurement unit 18 may include a beam splitter 18a, a transfer optical system 18b, and an image sensor 18c. The beam splitter 18a may cause a laser beam having passed through the output coupling mirror 15 and the beam splitter 17a to be transmitted at high transmittance toward the exposure device 100, and may reflect a portion of the laser beam toward the transfer optical system 18b. The transfer optical system 18b may cause an image of a cross-section of light reflected by the beam splitter 18a to be transferred as a beam profile of the laser beam onto a photosensitive surface of the image sensor 18c. The image sensor 18c may detect the beam profile of the laser beam transferred onto the photosensitive surface, and may output, to the laser control unit 30, data representing the detected beam profile.

2.4 Laser Control Unit

The laser control unit 30 may exchange various types of signals with an exposure device control unit 110 provided in the exposure device 100. For example, a laser beam output start signal may be received from the exposure device control unit 110. In addition, the laser control unit 30 may send a charging voltage setting signal to the charger 12, an instruction signal for turning a switch on or off to the pulse power module 13, or the like.

The laser control unit 30 may receive data representing the pulse energy from the pulse energy measurement unit 17, and may control the charging voltage of the charger 12 by referring to that data representing the pulse energy. The pulse energy of the laser beam may be controlled by controlling the charging voltage of the charger 12.

In addition, the laser control unit 30 may count the number of oscillation pulses in the excimer laser apparatus based on data received from the pulse energy measurement unit 17. In addition, the laser control unit 30 may send a rotating speed control signal to the rotating speed control unit 31 in accordance with a target value of the rotating speed of the cross flow fan 21.

2.5 Heat Exchanger

Figure 2:
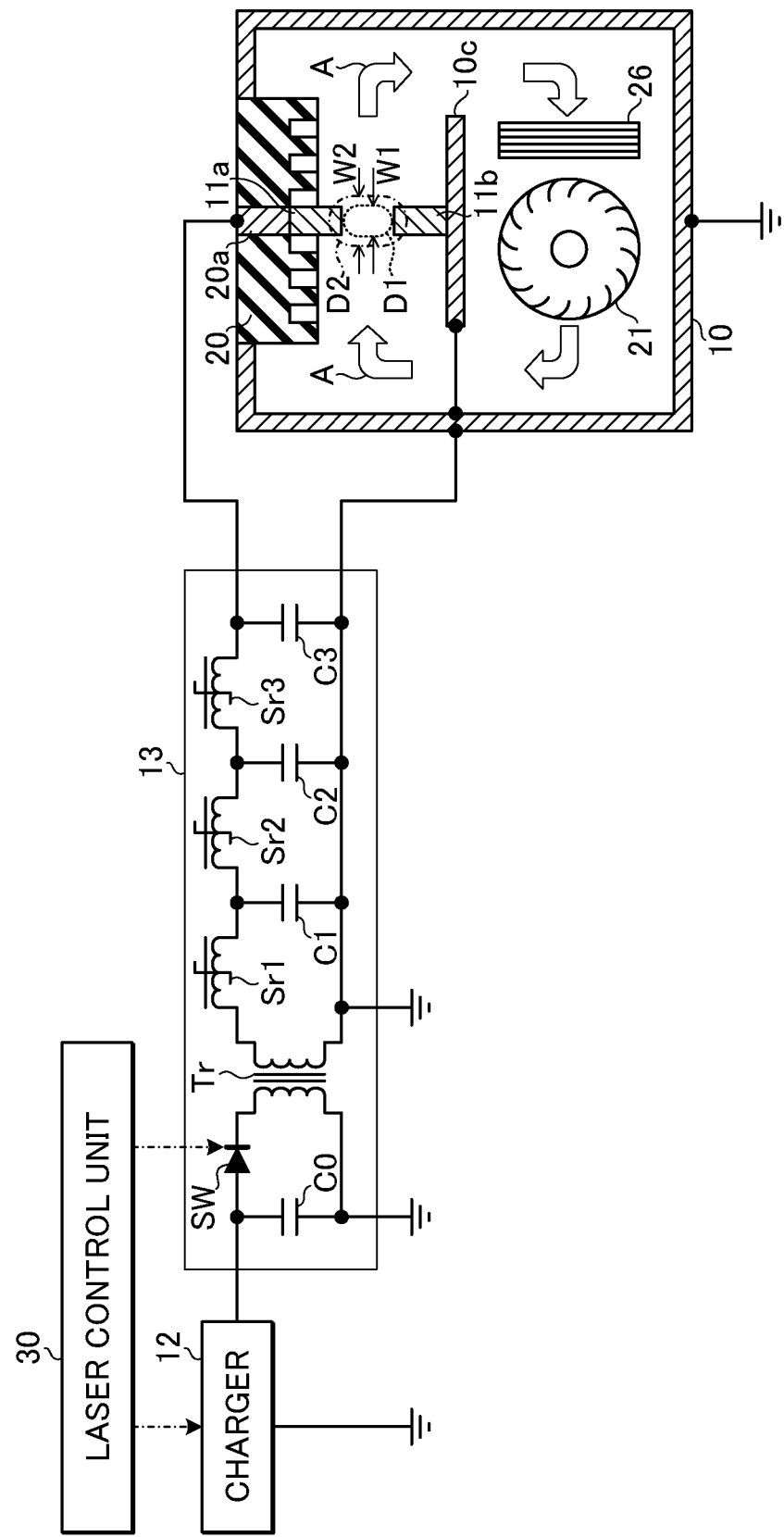
FIG. 2 shows an internal configuration of a laser chamber shown in FIG. 1 and a configuration of a pulse power module shown in FIG. 1.

FIG. 2 shows an internal configuration of the laser chamber 10 shown in FIG. 1 and a configuration of the pulse power module 13 shown in FIG. 1. FIG. 2 shows the internal configuration of the laser chamber 10 as viewed from a direction substantially parallel to the direction that the laser beam travels. A conductive member including the internal dividing plate 10c of the laser chamber 10 may be connected to a ground potential. The electrode 11b may be connected to the ground potential via the internal dividing plate 10c.

A heat exchanger 26 may be disposed within the laser chamber 10 in addition to the pair of electrodes 11a and 11b and the cross flow fan 21. Rotation of the cross flow fan 21 may cause the laser gas to circulate in the laser chamber 10 as indicated by arrows A. The heat exchanger 26 may cause a thermal energy of the laser gas heated to a high temperature through discharge to be exhausted out of the laser chamber 10.

2.6 Configuration of Pulse Power Module

The pulse power module 13 may include a main capacitor C0, a solid-state switch SW, a boosting transformer Tr, a plurality of magnetic switches Sr1 to Sr3, and a plurality of capacitors C1 to C3.

Each of the magnetic switches Sr1 to Sr3 may include a saturable reactor. Impedance of each of the magnetic switches Sr1 to Sr3 may become low when a time integrated value of voltages applied to both ends thereof reaches a predetermined voltage that is determined by the characteristics of that magnetic switch.

The main capacitor C0 may be charged by a predetermined charging voltage V applied from the charger 12. At this point in time, the solid-state switch SW may be in an insulative state.

The solid-state switch SW may include a semiconductor switch, and may correspond to the switch 13a described with reference to FIG. 1. The solid-state switch SW may become conductive on the basis of a signal from the laser control unit 30.

When the solid-state switch SW becomes conductive, electric charges stored in the main capacitor C0 by the charging voltage V may flow to a primary side of the boosting transformer Tr. Then, due to magnetic flux generated in the boosting transformer Tr, induction voltage may be generated on a secondary side of the boosting transformer Tr. At this point in time, the voltage on the secondary side may be boosted according to the winding ratio between the primary and secondary sides of the boosting transformer Tr.

When the time integrated value of voltages applied to both ends of the magnetic switch Sr1 reaches the predetermined value due to the induction voltage generated on the secondary side of the boosting transformer Tr, the magnetic switch Sr1 may be changed to have low impedance. As a result, an electric current may flow through a first loop including the secondary side of the boosting transformer Tr, the magnetic switch Sr1, and the capacitor C1. This may allow the capacitor C1 to be charged.

When the time integrated value of voltages applied to both ends of the magnetic switch Sr2 reaches the predetermined value due to the charge in the capacitor C1, the magnetic switch Sr2 may be changed to have low impedance. As a result, an electric current may flow through a second loop including the capacitor C1, the magnetic switch Sr2, and the capacitor C2. This may allow the capacitor C2 to be charged.

When the second loop is configured to have low inductance than the first loop, pulse compression may be performed. That is, the electric current flowing through the second loop may be a pulse current that is smaller in pulse width and larger in peak value than the electric current flowing through the first loop.

Similarly, the pulse current is transferred from the second loop to a third loop including the capacitor C2, the magnetic switch Sr3, and the capacitor C3, and further pulse compression may be performed.

When the voltage of the capacitor C3 reaches a breakdown voltage, insulation breakdown may occur in the laser gas between the pair of electrodes 11a and 11b. This may cause the laser gas to be excited to generate a pulse laser beam. Such a discharging operation may be repeated by the switching operation of the solid-state switch SW. Accordingly, the pulse laser beam may be outputted at a predetermined oscillating frequency. Note here that energy Ein that is inputted to the pair of electrodes 11a and 11b may be expressed by the following equation:

$$Ein = T \cdot C_0 \cdot V^2 / 2,$$

where T may be transfer efficiency and $C_0$ may be the capacitance of the main capacitor C0.

2.7 Increase in Width of Discharge Region Due to Wearing Out of Electrodes

Application of a high voltage between the pair of electrodes 11a and 11b may cause discharge to occur in a discharge region D1 shown in FIG. 2. The discharge region D1 may have a width W1 of discharge region that is slightly wider than the width of the electrode 11a or the width of the electrode 11b.

When repetition of discharge wears out the pair of electrodes 11a and 11b and increases an electrode gap G (see FIG. 1), the discharge region may be expanded, too. As compared with the discharge region D1 before the wearing out of the pair of electrodes 11a and 11b, a discharge region D2 expanded by the wearing out of the pair of electrodes 11a and 11b may have a width W2 of discharge region that is larger than the width W1 of discharge region. Assuming that the rotating speed of the cross flow fan 21 is constant, an increase in width of discharge region may lead to a decrease in the aforementioned CR value.

Therefore, the following process may be performed to increase the rotating speed of the cross flow fan 21 according to the wearing out of the pair of electrodes 11a and 11b.

3. Control of Rotating Speed of Fan

3.1 First Example of Control

Figure 3:
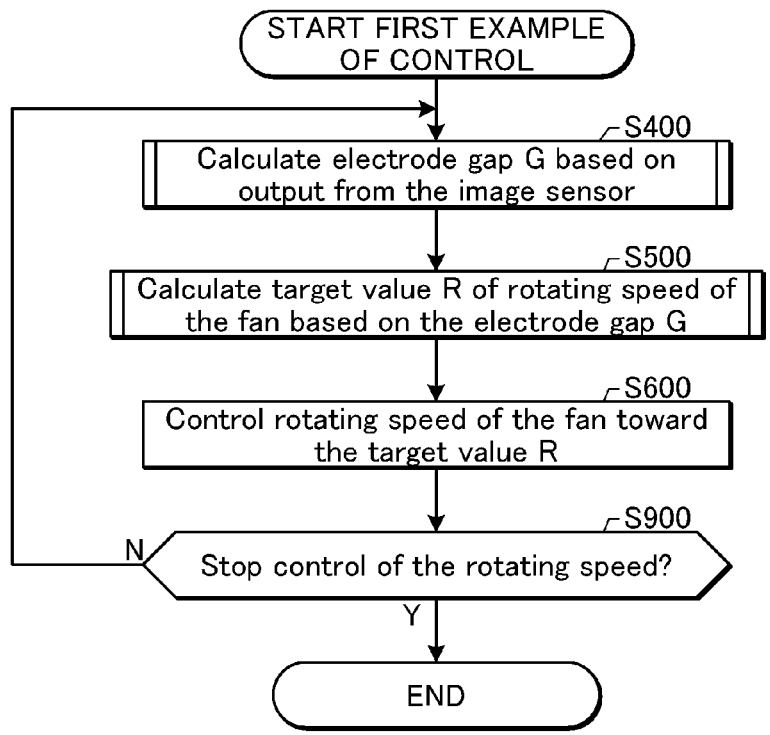
FIG. 3 is a flowchart illustrating a first example of controlling rotating speed of a fan according to the present disclosure.

FIG. 3 is a flowchart illustrating a first example of controlling the rotating speed of the fan according to the present disclosure. The process shown in FIG. 3 may be performed by the laser control unit 30 (FIG. 1) in the excimer laser apparatus according to the first embodiment.

First, the laser control unit 30 may calculate the electrode gap G on the basis of the output from the image sensor 18c of the beam profile measurement unit 18 (S400). Details of this process will be described below with reference to FIGS. 4A and 4B.

Next, the laser control unit 30 may calculate a target value R of the rotating speed of the fan on the basis of the electrode gap G thus calculated (S500). Details of this process will be described below with reference to FIGS. 5A to 5C.

Next, the laser control unit 30 may send a rotating speed control signal to the rotating speed control unit 31 so that the rotating speed of the fan becomes closer to the target value R. The rotating speed control unit 31 may control the rotating speed of the fan by controlling the speed of rotation or torque of the motor 22 in accordance with the rotating speed control signal (S600).

Next, the laser control unit 30 may determine whether to stop the control of the rotating speed (S900). For example, upon receiving a laser beam output stop signal from the exposure device control unit 110, the laser control unit 30 may determine to stop the control of the rotating speed. In a case where the control of the rotating speed is stopped (S900; YES), the laser control unit 30 may end the process according to this flowchart. In a case where the control of the rotating speed is not stopped (S900; NO), the laser control unit 30 may return to the aforementioned S400 and repeat the subsequent processes.

As described above, in the first example of control, the rotating speed of the fan may be controlled on the basis of a result of calculation of the electrode gap G.

Figure 4A:
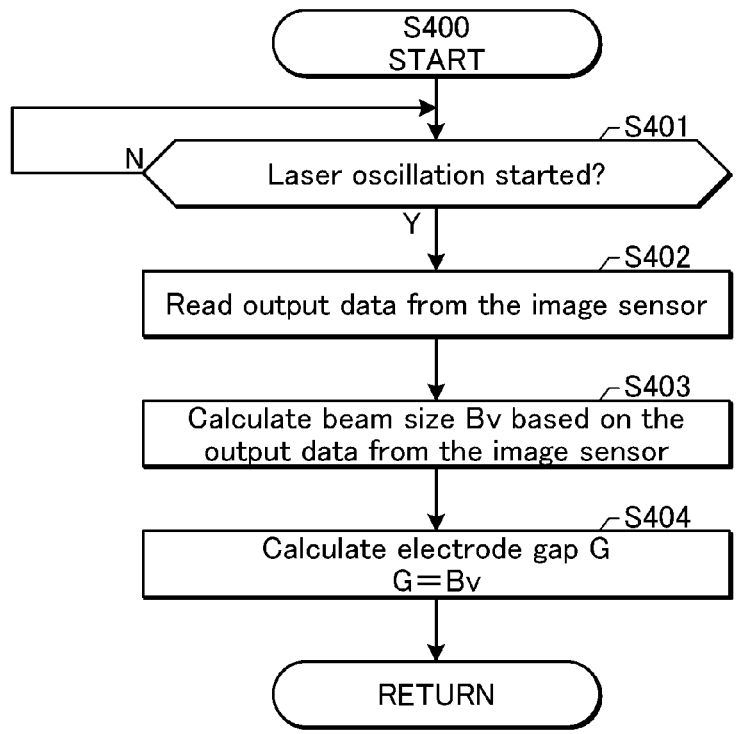
FIG. 4A is a flowchart illustrating an example of a process for calculating an electrode gap shown in FIG. 3.

FIG. 4A is a flowchart illustrating an example of the process for calculating the electrode gap G shown in FIG. 3. The process shown in FIG. 4A may be performed by the laser control unit 30 as a subroutine of S400 shown in FIG. 3.

The laser control unit 30 may determine whether laser oscillation has been started (S401). The determination as to whether laser oscillation has been started may be made on the basis of whether the laser control unit 30 has sent various signals for laser oscillation to the charger 12 and the pulse power module 13. Alternatively, the determination as to whether laser oscillation has been started may be made on the basis of whether the laser control unit 30 has received, from the pulse energy measurement unit 17, data representing a pulse energy E.

In a case where laser oscillation has not been started (S401; NO), the laser control unit 30 may repeat the determination until laser oscillation is started. In a case where laser oscillation has been started (S401; YES), the laser control unit 30 may proceed to S402.

In S402, the laser control unit 30 may read output data from the image sensor 18c of the beam profile measurement unit 18.

Figure 4B:
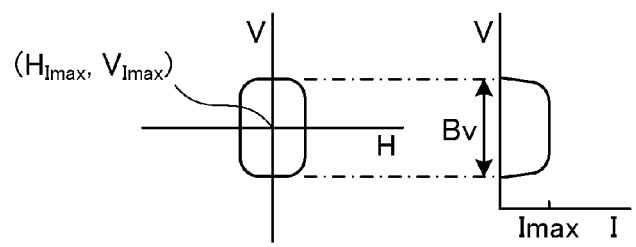
FIG. 4B schematically illustrates a part of output data from an image sensor.

FIG. 4B schematically illustrates a part of the output data from the image sensor 18c. The output data from the image sensor 18c may be image data representing the image of the cross-section of the laser beam transferred by the transfer optical system 18b. The image data may, for example, be expressed as bitmap data. The bitmap data may be data obtained by dividing the image into a large number of pixels in grid-like shape and expressing light intensities I in these pixels as numerical values, respectively. The positions of these pixels may be represented by a position along an H axis that is parallel to the cross direction of the electrode 11a or 11b and a position along a V axis that is parallel to a direction from the electrode 11a toward the electrode 11b.

Next, the laser control unit 30 may calculate a beam size By of the laser beam on the basis of the output data from the image sensor 18c (S403). The calculation of the beam size By of the laser beam may be performed in the following manner. The laser control unit 30 may choose the pixel ($H_{Imax}$, $V_{Imax}$) of the highest light intensity I from the image data shown in FIG. 4B. The laser control unit 30 may extract data representing the light intensity I at the position of $H_{Imax}$ along the V axis from a part of the image data shown on the left side of FIG. 4B. The data representing the light intensity I thus extracted may have a distribution shown on the right side of FIG. 4B. The laser control unit 30 may calculate the beam size By from the distribution shown on the right side of FIG. 4B. The beam size By may be a size of a region having a light intensity equal to or greater than $1/e^2$ of the light intensity Imax in the pixel ($H_{Imax}$, $V_{Imax}$). Note here that e may be a Napier's constant. A ratio of the light intensity to the Imax is not limited to $1/e^2$, and a different ratio may be used. Furthermore, in a case where a transfer magnification of the transfer optical system 18b is not 1, a correction may be made on the basis of the transfer magnification.

Next, the laser control unit 30 may calculate the electrode gap G on the basis of the beam size By (S404). For example, the electrode gap G, which is assumed to substantially match the beam size By, may be calculated according to the following equation:

$$G = By.$$

Once the electrode gap G is calculated, the laser control unit 30 may end the process according to this flowchart and proceed to S500 shown in FIG. 3.

Figure 5A:
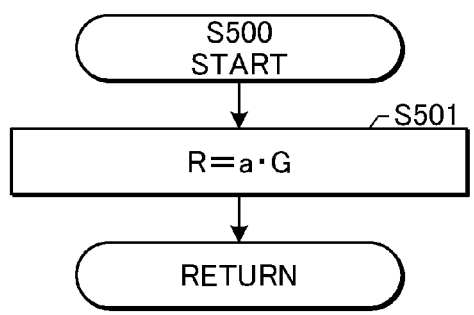
FIG. 5A is a flowchart showing one example of a process for calculating a target value of the rotating speed of the fan shown in FIG. 3.

FIG. 5A is a flowchart showing one example of the process for calculating the target value R of the rotating speed of the fan shown in FIG. 3. The process shown in FIG. 5A may be performed by the laser control unit 30 as a subroutine of S500 shown in FIG. 3.

The laser control unit 30 may calculate the target value R of the rotating speed of the fan according to the following equation (S501):

$$R = a \cdot G,$$

where a may be a positive number that is used as a constant of proportionality. In this way, the target value R of the rotating speed of the fan may be proportional to the electrode gap G.

Once the target value R of the rotating speed of the fan is calculated, the laser control unit 30 may end the process according to this flowchart and proceed to S600 shown in FIG. 3.

Figure 5B:
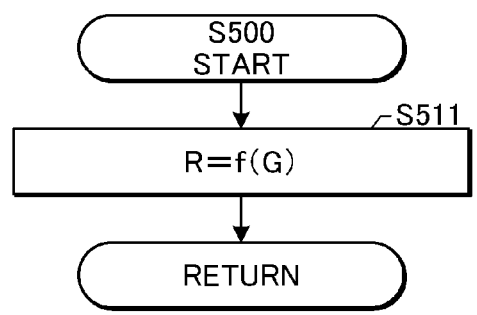
FIG. 5B is a flowchart showing another example of the process for calculating a target value of the rotating speed of the fan shown in FIG. 3.

FIG. 5B is a flowchart showing another example of the process for calculating the target value R of the rotating speed of the fan shown in FIG. 3. The process shown in FIG. 5B may be performed by the laser control unit 30 as a subroutine of S500 shown in FIG. 3.

The laser control unit 30 may calculate the target value R of the rotating speed of the fan according to the following equation (S511):

$$R = f(G),$$

where f(G) may be a function whose derivative value becomes larger as the electrode gap G becomes larger. For example, f(G) may be a quadratic function or an exponential function. In a case where a pressure loss changes according to a change in the electrode gap G, it may be desirable that the target value R of the rotating speed of the fan not be proportional to the electrode gap G.

Once the target value R of the rotating speed of the fan is calculated, the laser control unit 30 may end the process according to this flowchart and proceed to S600 shown in FIG. 3.

Figure 5C:
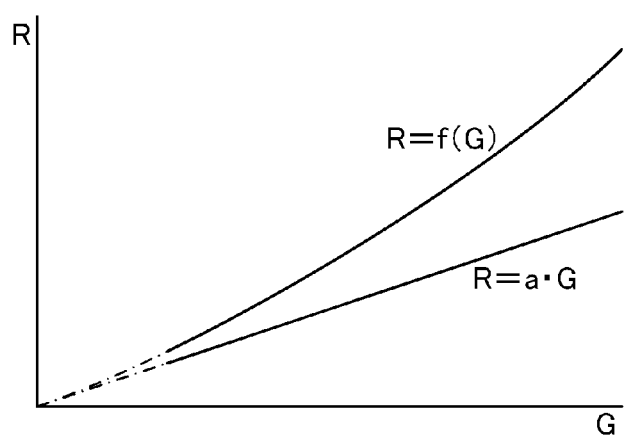
FIG. 5C illustrates relationships between the target value of the rotating speed of the fan and the electrode gap.

FIG. 5C illustrates relationships between the target value R of the rotating speed of the fan and the electrode gap G.

3.2 Second Example of Control

Figure 6:
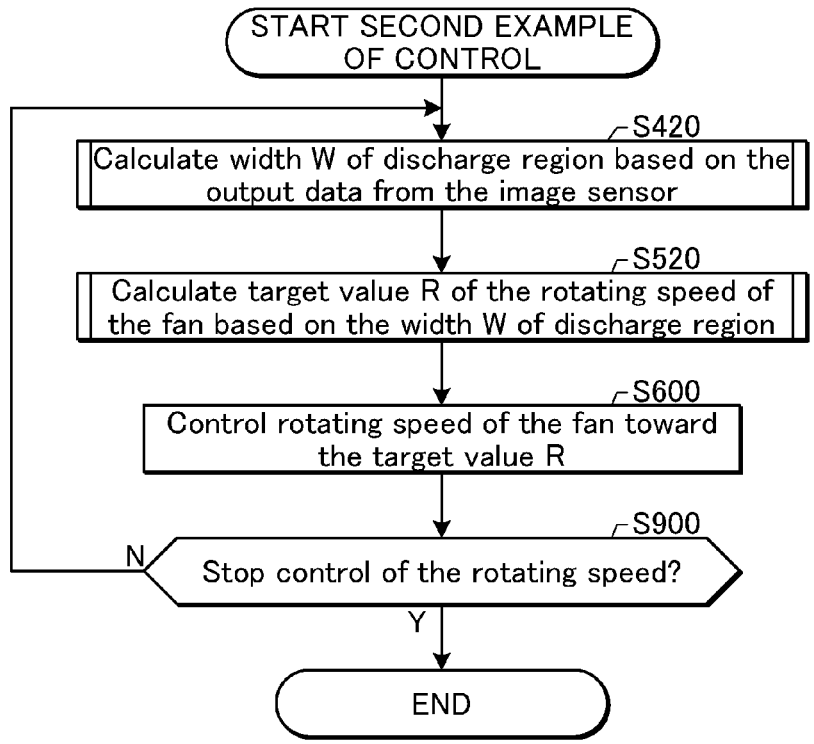
FIG. 6 is a flowchart illustrating a second example of controlling the rotating speed of the fan according to the present disclosure.

FIG. 6 is a flowchart illustrating a second example of controlling the rotating speed of the fan according to the present disclosure. The process shown in FIG. 6 may be performed by the laser control unit 30 (FIG. 1) in the excimer laser apparatus according to the first embodiment.

The second example of control may differ from the first example of control shown in FIG. 3 in terms of calculating the width W of discharge region on the basis of the output from the image sensor 18c (S420) and calculating the target value R of the rotating speed of the fan on the basis of the width W of discharge region (S520). In other respects, the second example of control may be identical to the first example of control.

Figure 7A:
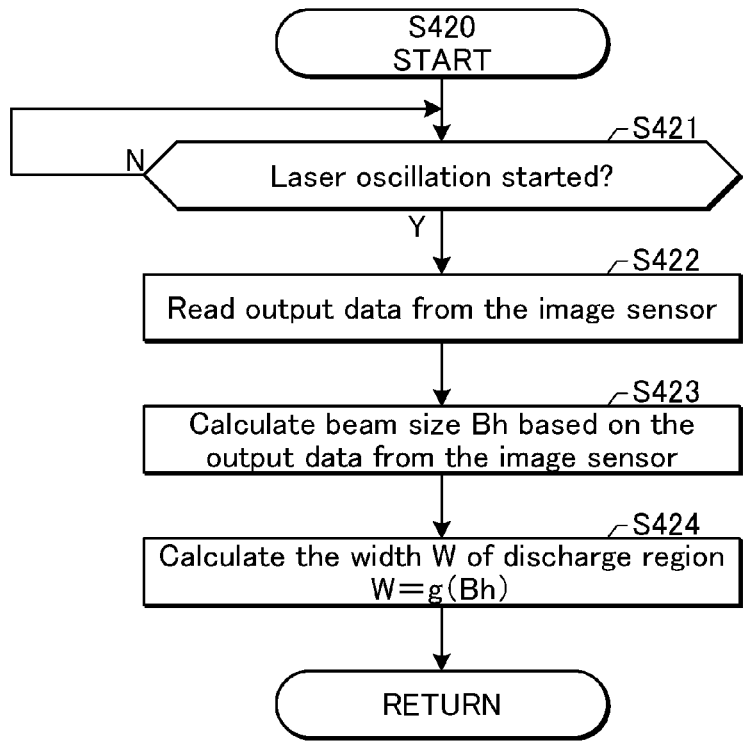
FIG. 7A is a flowchart illustrating an example of a process for calculating a width of discharge region shown in FIG. 6.

FIG. 7A is a flowchart illustrating an example of the process for calculating the width W of discharge region shown in FIG. 6. The process shown in FIG. 7A may be performed by the laser control unit 30 as a subroutine of S420 shown in FIG. 6.

The laser control unit 30 may determine whether laser oscillation has been started (S421). This process may be identical to the process of S401 described with reference to FIG. 4A.

In S422, the laser control unit 30 may read output data from the image sensor 18c of the beam profile measurement unit 18. This process may be identical to the process of S402 described with reference to FIG. 4A.

Next, the laser control unit 30 may calculate a beam size Bh of the laser beam on the basis of the output data from the image sensor 18c (S423).

Figure 7B:
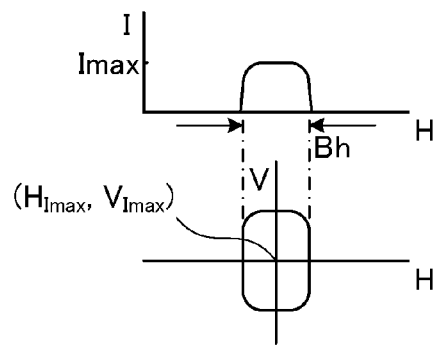
FIG. 7B schematically illustrates a part of output data from an image sensor.

FIG. 7B schematically illustrates a part of the output data from the image sensor 18c.

The calculation of the beam size Bh of the laser beam may be performed in the following manner. The laser control unit 30 may choose the pixel ($H_{Imax}$, $V_{Imax}$) of the highest light intensity I from the image data shown in FIG. 7B. The laser control unit 30 may extract data representing the light intensity I at the position of $V_{Imax}$ along the H axis from a part of the image data shown on the lower side of FIG. 7B. The data representing the light intensity I thus extracted may have a distribution shown on the upper side of FIG. 7B. The laser control unit 30 may calculate the beam size Bh from the distribution shown on the upper side of FIG. 7B. The beam size Bh may be a size of a region having a light intensity equal to or greater than $1/e^2$ of the light intensity Imax in the pixel ($H_{Imax}$, $V_{Imax}$).

Next, the laser control unit 30 may calculate the width N of discharge region on the basis of the beam size Bh (S424). For example, a relational expression between the width W of discharge region and the beam size Bh may be stored in the after-mentioned memory, and the width N of discharge region may be calculated on the basis of the relational expression. The relational expression between the width W of discharge region and the beam size Bh may be expressed as follows:

$$W = g(Bh).$$

Once the width W of discharge region is calculated, the laser control unit 30 may end the process according to this flowchart and proceed to S520 shown in FIG. 6.

Figure 8A:
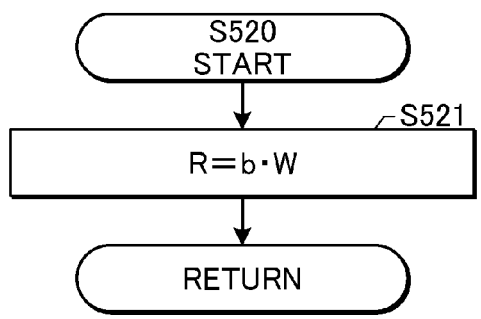
FIG. 8A is a flowchart showing one example of a process for calculating a target value of the rotating speed of the fan shown in FIG. 6.

FIG. 8A is a flowchart showing one example of the process for calculating the target value R of the rotating speed of the fan shown in FIG. 6. The process shown in FIG. 8A may be performed by the laser control unit 30 as a subroutine of S520 shown in FIG. 6.

The laser control unit 30 may calculate the target value R of the rotating speed of the fan according to the following equation (S521):

$$R = b \cdot N,$$

where b may be a positive number that is used as a constant of proportionality. In this way, the target value R of the rotating speed of the fan may be proportional to the width W of discharge region.

Once the target value R of the rotating speed of the fan is calculated, the laser control unit 30 may end the process according to this flowchart and proceed to S600 shown in FIG. 6.

Figure 8B:
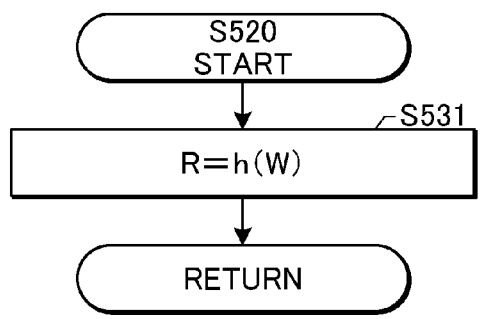
FIG. 8B is a flowchart showing another example of the process for calculating a target value of the rotating speed of the fan shown in FIG. 6.

FIG. 8B is a flowchart showing another example of the process for calculating the target value R of the rotating speed of the fan shown in FIG. 6. The process shown in FIG. 8B may be performed by the laser control unit 30 as a subroutine of S520 shown in FIG. 6.

The laser control unit 30 may calculate the target value R of the rotating speed of the fan according to the following equation (S531):

$$R = h(W),$$

where h(W) may be a function whose derivative value becomes larger as the width W of discharge region becomes larger. For example, h(W) may be a quadratic function or an exponential function. In a case where a pressure loss changes according to a change in the electrode gap G, it may be desirable that the target value R of the rotating speed of the fan is not proportional to the width W of discharge region.

Once the target value R of the rotating speed of the fan is calculated, the laser control unit 30 may end the process according to this flowchart and proceed to S600 shown in FIG. 6.

Figure 8C:
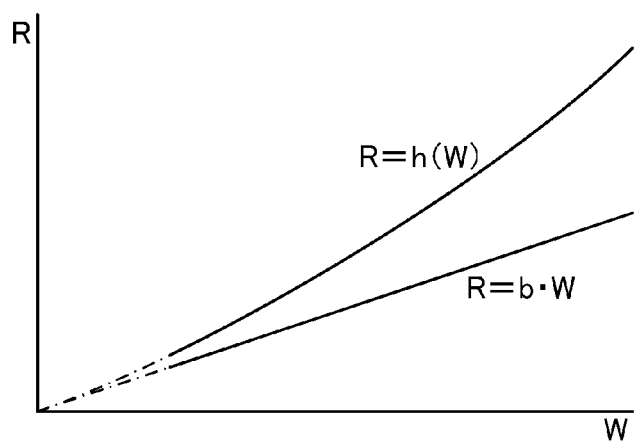
FIG. 8C illustrates relationships between the target value of the rotating speed of the fan and the width of discharge region.

FIG. 8C illustrates relationships between the target value R of the rotating speed of the fan and the width W of discharge region.

3.3 Third Example of Control

Figure 9:
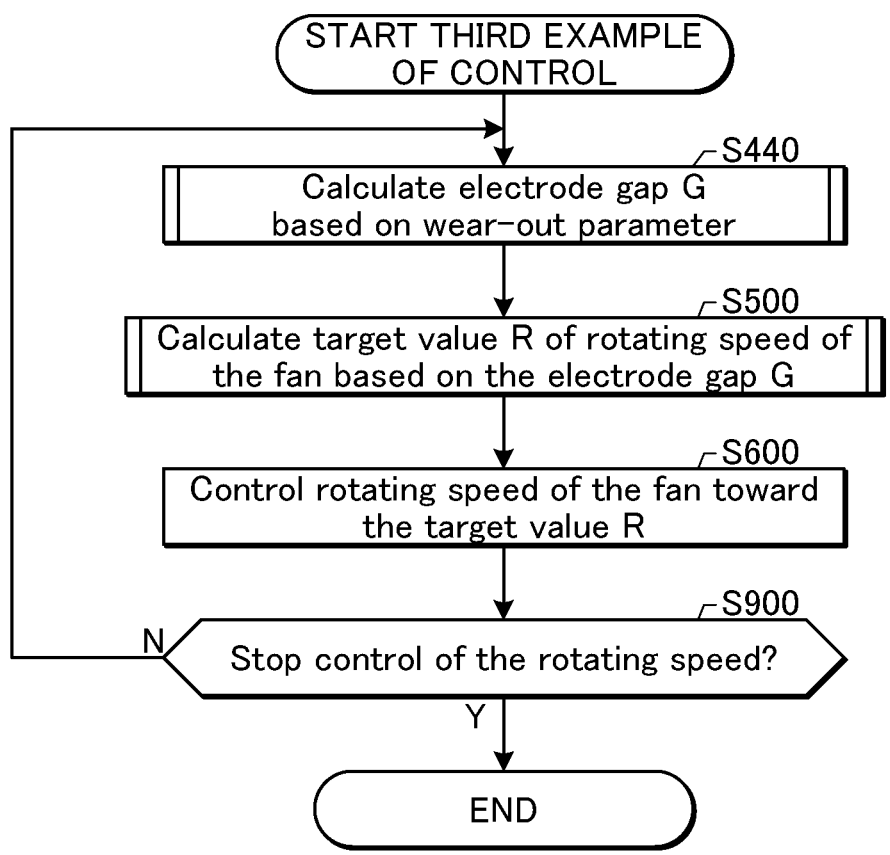
FIG. 9 is a flowchart illustrating a third example of controlling the rotating speed of the fan according to the present disclosure.

FIG. 9 is a flowchart illustrating a third example of controlling the rotating speed of the fan according to the present disclosure. The process shown in FIG. 9 may be performed by the laser control unit 30 (FIG. 1) in the excimer laser apparatus according to the first embodiment.

The third example of control may differ from the first example of control shown in FIG. 3 in terms of calculating the electrode gap G on the basis of the wear-out parameter of the pair of electrodes 11a and 11b (S440). In other respects, the third example of control may be identical to the first example of control.

The wear-out parameter may be a parameter that correlates with a degree of wearing out of the pair of electrodes 11a and 11b. The wear-out parameter may, for example, be a total number of pulses Nch of the laser chamber that will be described below with reference to FIGS. 10A and 10B. Alternatively, the wear-out parameter may be an integrated value of input energy of the laser chamber that will be described below with reference to FIGS. 11A and 11B. Alternatively, the wear-out parameter may, for example, be the electrode gap G in the first example of control or the width W of discharge region in the second example of control.

Figure 10A:
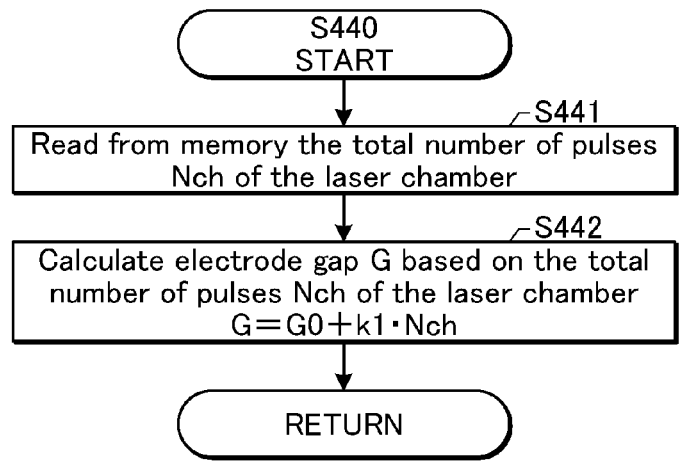
FIG. 10A is a flowchart illustrating one example of a process for calculating an electrode gap shown in FIG. 9.

FIG. 10A is a flowchart illustrating one example of the process for calculating the electrode gap G shown in FIG. 9. The process shown in FIG. 10A may be performed by the laser control unit 30 as a subroutine of S440 shown in FIG. 9.

The laser control unit 30 may read, from the after-mentioned memory, data representing the total number of pulses Nch of the laser chamber (S441). The process for calculating the total number of pulses Nch of the laser chamber will be described below with reference to FIG. 10B.

Next, the laser control unit 30 may calculate the electrode gap G on the basis of the total number of pulses Nch of the laser chamber according to the following equation (S442):

$$G = G0 + k1 \cdot Nch,$$

where G0 may be an initial value of the electrode gap and k1 may be a positive number that is used as a constant of proportionality. In this way, with the initial value G0 as a starting point, the electrode gap G may increase in proportion to an increase in the total number of pulses Nch of the laser chamber.

Once the electrode gap G is calculated, the laser control unit 30 may end the process according to this flowchart and proceed to S500 shown in FIG. 9.

Figure 10B:
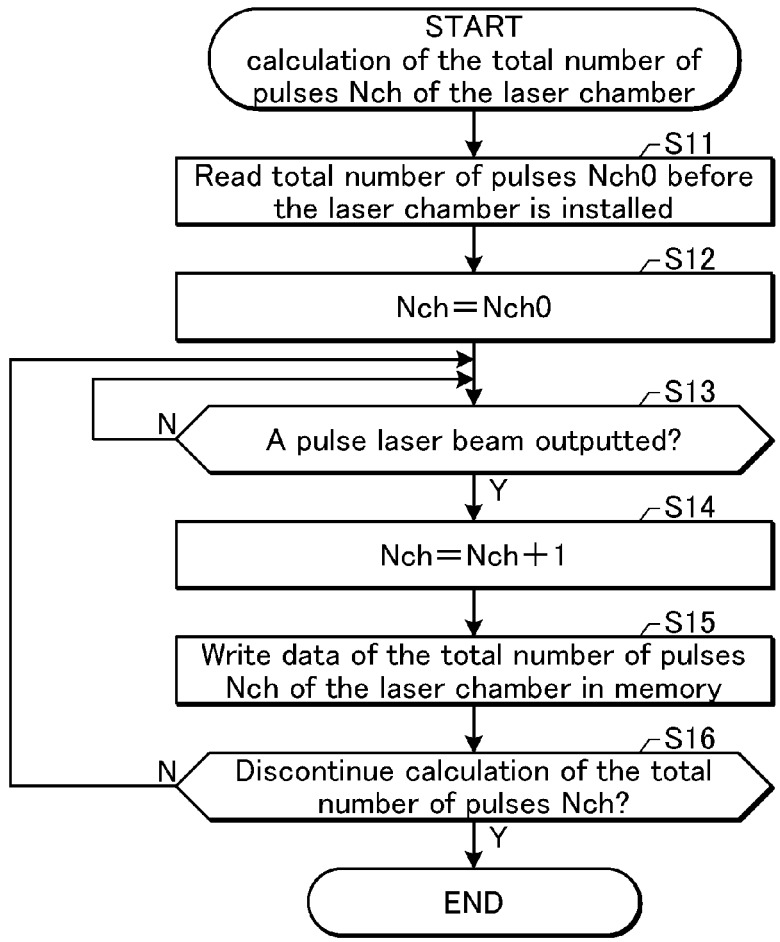
FIG. 10B is a flowchart for calculating a total number of pulses of the laser chamber.

FIG. 10B is a flowchart for calculating the total number of pulses Nch of the laser chamber. The process shown in FIG. 10B may be performed by the laser control unit 30 (FIG. 1) independently of the calculation of the electrode gap G and the control of the rotating speed of the fan shown in FIG. 9. The total number of pulses Nch of the laser chamber may be a total number of pulses of a pulse voltage supplied between the pair of electrodes 11a and 11b since the electrodes were installed within the laser chamber.

First, when the laser chamber 10 has been installed, the laser control unit 30 may read data representing a total number of pulses Nch0 before the placement of the laser chamber 10 (S11). In a case where the laser chamber 10 had been used in another place or subjected to an operation test before the laser chamber 10 was installed, the total number of pulses Nch0 before the placement of the laser chamber 10 may be a number that is greater than 0. The data representing the total number of pulses Nch0 before the placement of the laser chamber 10 may be data stored in the after-mentioned memory together with a code for identifying the laser chamber, or may be data inputted by a user.

Next, the laser control unit 30 may set the total number of pulses Nch of the laser chamber to Nch0 (S12).

Next, the laser control unit 30 may determine whether a pulse laser beam has been outputted (S13). The pulse laser beam may be a laser beam of one pulse. The determination as to whether the pulse laser beam has been outputted may be made, for example, on the basis of whether data representing a pulse energy E has been received from the pulse energy measurement unit 17. In a case where no pulse laser beam is outputted (S13: NO), the laser control unit 30 may repeat this determination until the pulse laser beam is outputted.

In a case where the pulse laser beam has been outputted (S13: YES), the laser control unit 30 may update the value of Nch by adding 1 to the total number of pulses Nch of the laser chamber (S14).

Next, the laser control unit 30 may write, in the after-mentioned memory, the data representing the total number of pulses Nch of the laser chamber (S15). The degree of wearing out of the pair of electrodes 11a and 11b may be determined by the total number of pulses Nch of the laser chamber.

Next, the laser control unit 30 may determine whether to discontinue the calculation of the total number of pulses Nch of the laser chamber (S16). In a case where the calculation is discontinued, the laser control unit 30 may end the process according to this flowchart. For example, in a case where the laser chamber 10 exhausts its life span and needs to be replaced, the calculation may be discontinued. In a case where the calculation is not discontinued, the laser control unit 30 may return to the aforementioned S13 and repeat the subsequent processes.

Figure 11A:
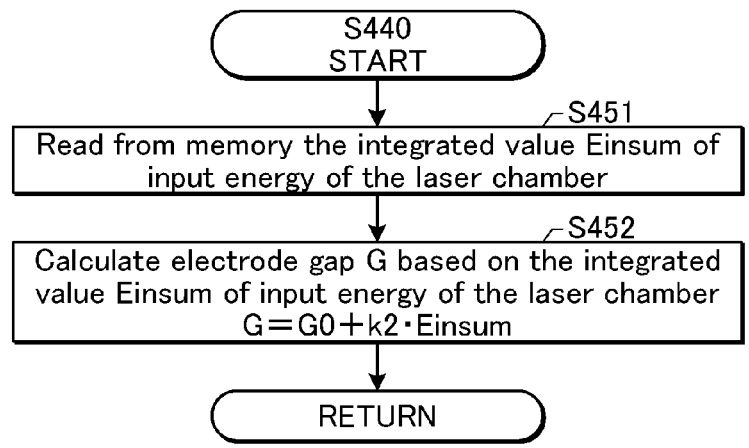
FIG. 11A is a flowchart illustrating another example of the process for calculating an electrode gap shown in FIG. 9.

FIG. 11A is a flowchart illustrating another example of the process for calculating the electrode gap G shown in FIG. 9. The process shown in FIG. 11A may be performed by the laser control unit 30 as a subroutine of S440 shown in FIG. 9.

The laser control unit 30 may read, from the after-mentioned memory, data representing an integrated value Einsum of input energy of the laser chamber (S451). The process for calculating the integrated value Einsum of input energy of the laser chamber will be described below with reference to FIG. 11B.

Next, the laser control unit 30 may calculate the electrode gap G on the basis of the integrated value Einsum of input energy of the laser chamber according to the following equation (S452):

$$G=G0+k2 \cdot Einsum,$$

where G0 may be an initial value of the electrode gap and k2 may be a positive number that is used as a constant of proportionality. In this way, with the initial value G0 as a starting point, the electrode gap G may increase in proportion to an increase in the integrated value Einsum of input energy of the laser chamber.

Once the electrode gap G is calculated, the laser control unit 30 may end the process according to this flowchart and proceed to S500 shown in FIG. 9.

Figure 11B:
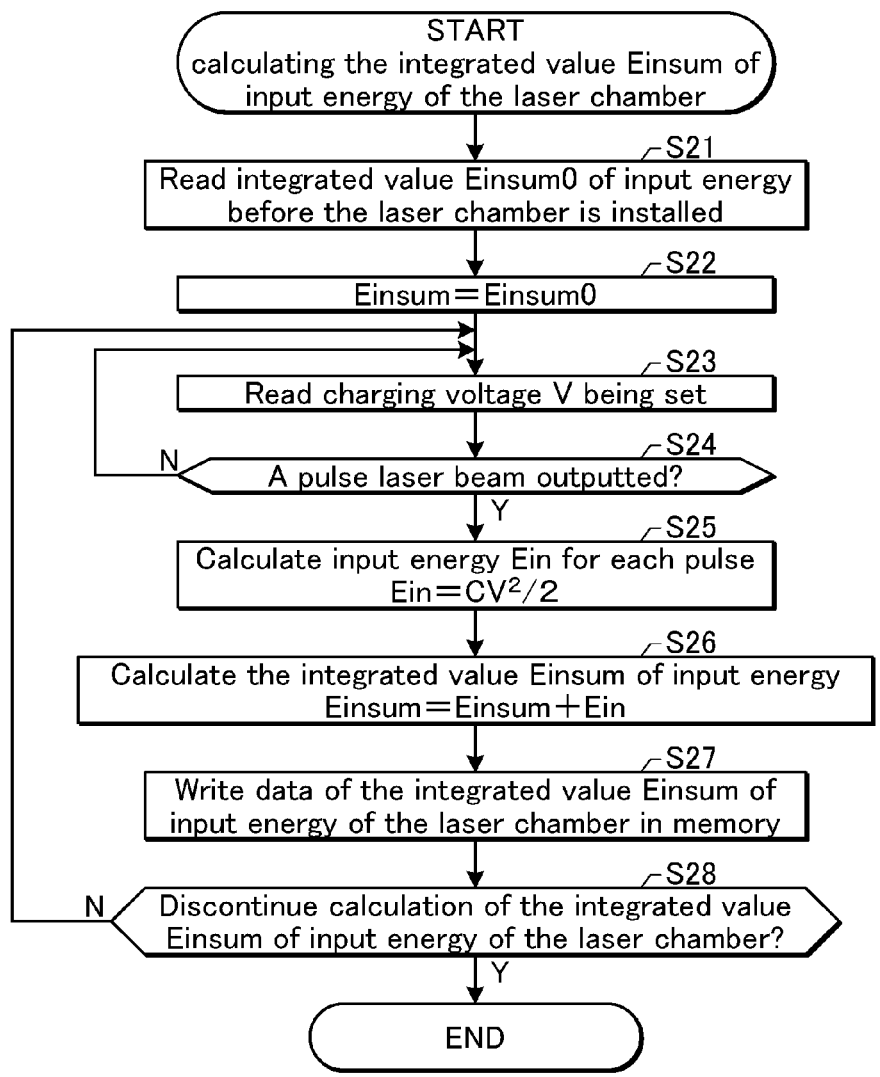
FIG. 11B is a flowchart for calculating an integrated value of input energy of the laser chamber.

FIG. 11B is a flowchart for calculating the integrated value Einsum of input energy of the laser chamber. The process shown in FIG. 11B may be performed by the laser control unit 30 (FIG. 1) independently from the calculation of the electrode gap G and the control of the rotating speed of the fan shown in FIG. 9. The integrated value Einsum of input energy of the laser chamber may be an integrated value of energy inputted between the pair of electrodes 11a and 11b since the electrodes were installed within the laser chamber.

First, when the laser chamber 10 has been installed, the laser control unit 30 may read data representing the integrated value Einsum of input energy before the placement of the laser chamber 10 (S21). In a case where the laser chamber 10 had been used in another place or subjected to an operation test before the laser chamber 10 was installed, the integrated value Einsum of input energy before the placement of the laser chamber 10 may be greater than 0. The data representing the integrated value Einsum of input energy before the placement of the laser chamber 10 may be data stored in the after-mentioned memory together with a code for identifying the laser chamber, or may be data inputted by a user.

Next, the laser control unit 30 may set the integrated value Einsum of input energy of the laser chamber to Einsum0 (S22).

Next, the laser control unit 30 may read a charging voltage V of the charger 12 (S23). The charging voltage V of the charger 12 may be a charging voltage set by the laser control unit 30.

Next, the laser control unit 30 may determine whether a pulse laser beam has been outputted (S24). The pulse laser beam may be a laser beam of one pulse. The determination as to whether the pulse laser beam has been outputted may be made, for example, on the basis of whether data representing a pulse energy E has been received from the pulse energy measurement unit 17. In a case where no pulse laser beam is outputted (S24: NO), the laser control unit 30 may return to the aforementioned S23.

In a case where the pulse laser beam has been outputted (S24: YES), the laser control unit 30 may calculate the input energy Kin for each pulse (S25). The input energy Kin for each pulse may be calculated according to the following equation:

$$Ein=CV^2/2,$$

where V may be the charging voltage of the charger 12. C may be a value that is given as $C=t \cdot C_0$, where $C_0$ is the capacitance of the main capacitor described with reference to FIG. 2 and t is the transfer efficiency of energy in the pulse power module 13.

Next, the laser control unit 30 may update the value of Einsum by adding the input energy Kin for each pulse to the integrated value Einsum of input energy of the laser chamber (S26).

Next, the laser control unit 30 may write, in the after-mentioned memory, the data representing the integrated value Einsum of input energy of the laser chamber (S27). The degree of wearing out of the pair of electrodes 11a and 11b may be determined by the integrated value Einsum of input energy of the laser chamber.

Next, the laser control unit 30 may determine whether to discontinue the calculation of the integrated value Einsum of input energy of the laser chamber (S28). In a case where the calculation is discontinued, the laser control unit 30 may end the process according to this flowchart. For example, in a case where the laser chamber 10 exhausts its life span and needs to be replaced, the calculation may be discontinued. In a case where the calculation is not discontinued, the laser control unit 30 may return to the aforementioned S23 and repeat the subsequent processes.

3.4 Fourth Example of Control

Figure 12:
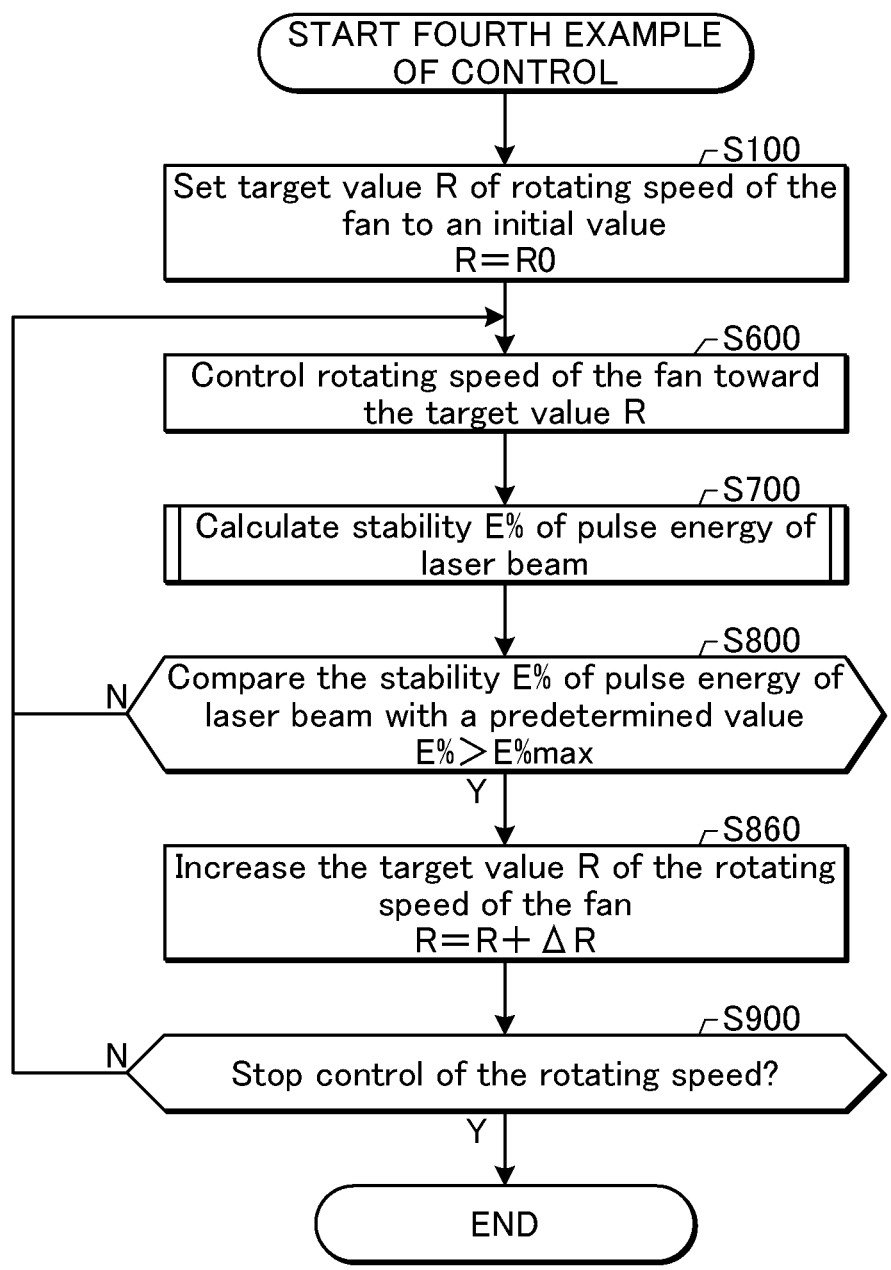
FIG. 12 is a flowchart illustrating a fourth example of controlling the rotating speed of the fan according to the present disclosure.

FIG. 12 is a flowchart illustrating a fourth example of controlling the rotating speed of the fan according to the present disclosure. The process shown in FIG. 12 may be performed by the laser control unit 30 (FIG. 1) in the excimer laser apparatus according to the first embodiment.

The fourth example of control may differ from the first example of control shown in FIG. 3 in terms of repeating the process for increasing the rotating speed of the fan when the discharge becomes unstable (S700, S800, S860). The process for calculating the electrode gap G and the process for calculating the target value R of the rotating speed of the fan from the electrode gap G (S400, S500) shown in FIG. 3 are not necessary here.

First, the laser control unit 30 may set the target value R of the rotating speed of the fan to an initial value R0 (S100). The initial value R0 may be such a value that the discharge is stable while the pair of electrodes 11a and 11b are new but the discharge may become unstable as the wearing out of the pair of electrodes 11a and 11b progresses.

Next, the laser control unit 30 may send a rotating speed control signal to the rotating speed control unit 31 so that the rotating speed of the fan becomes closer to the target value R (S600). This process may be identical to the process of S600 described with reference to FIG. 3.

Next, the laser control unit 30 may calculate a stability E % of pulse energy of the laser beam (S700). Details of this process will be described below with reference to FIG. 13.

Next, the laser control unit 30 may compare the stability E % of pulse energy of the laser beam with a predetermined value E % max (S800). The predetermined value E % max may be a threshold falling within an allowable range regarding the stability of pulse energy of the laser bean. In a case where the stability E % of pulse energy of the laser beam is equal to or less than the predetermined value E % max (S800: NO), the laser control unit 30 may return to the aforementioned S600. In a case where the stability E % of pulse energy of the laser beam exceeds the predetermined value E % max (S800: YES), the laser control unit 30 may proceed to s860.

In S860, the laser control unit 30 may increase the target value R of the rotating speed of the fan. For example, the target value R of the rotating speed of the fan may be updated by adding a predetermined value ΔR to the current target value R of the rotating speed of the fan. The predetermined value ΔR may be a positive number.

Next, the laser control unit 30 may determine whether to stop the control of the rotating speed (S900). This process may be identical to the process of S900 described with reference to FIG. 3. However, in a case where the control of the rotating speed is not stopped (S900; NO), the laser control unit 30 may return to the aforementioned S600 and repeat the subsequent processes.

Figure 13:
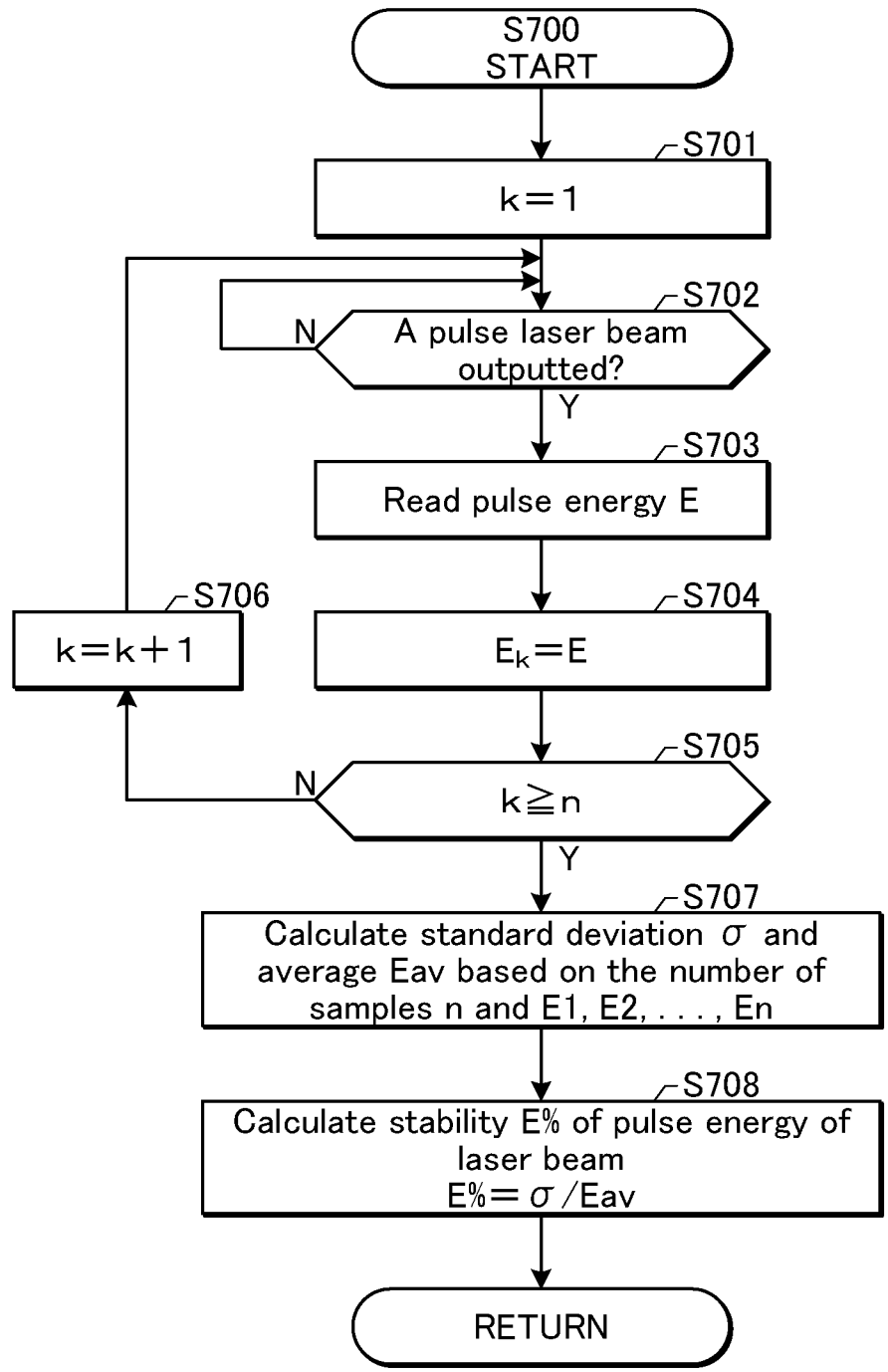
FIG. 13 is a flowchart illustrating an example of a process for calculating a stability of pulse energy of a laser beam shown in FIG. 12.

FIG. 13 is a flowchart illustrating an example of the process for calculating the stability E % of pulse energy of the laser beam shown in FIG. 12. The process shown in FIG. 13 may be performed by the laser control unit 30 (FIG. 1) as a subroutine of S700 shown in FIG. 12. The stability E % of pulse energy of the laser beam may be calculated on the basis of the pulse energy E received from the pulse energy measurement unit 17.

First, the laser control unit 30 may set a counter k to 1 (S701). The counter k may be a natural number.

Next, the laser control unit 30 may determine whether a pulse laser beam has been outputted (S702). The pulse laser beam may be a laser beam of one pulse. The determination as to whether the pulse laser beam has been outputted may be made, for example, on the basis of whether data representing a pulse energy E has been received from the pulse energy measurement unit 17. In a case where no pulse laser beam is outputted (S702: NO), the laser control unit 30 may repeat this determination until the pulse laser beam is outputted.

In a case where the pulse laser beam has been outputted (S702: YES), the laser control unit 30 may read the data representing the pulse energy E received from the pulse energy measurement unit 17 (S703).

Next, the laser control unit 30 may store the data representing the pulse energy E as pulse energy $E_k$ in the aftermentioned memory (S704).

Next, the laser control unit 30 may determine whether the value of the counter k has reached a constant value n (S705). The constant value n may be the number of samples of the pulse energy E that is used for calculating the stability E % of pulse energy of the laser beam. The constant value n may, for example, be 30 or greater and 100 or less.

In a case where the value of the counter k has not reached the constant value n (S705; NO), the laser control unit 30 may add 1 to the value of the counter k (S706) and return to the aforementioned S702.

In a case where the value of the counter k has reached the constant value n (S705; YES), the laser control unit 30 may proceed to S707.

In S707, the laser control unit 30 may calculate a standard deviation σ of pulse energy and an average value Eav of pulse energy from the constant value n, which indicates the number of samples, and the pulse energy $E_k$ (k=1, 2, . . . , n).

Next, the laser control unit 30 may calculate the stability E % of pulse energy of the laser beam according to the following equation (S708):

$E\% = \sigma/Eav.$

The degree of wearing out of the pair of electrodes 11a and 11b may be determined by the stability E % of pulse energy of the laser beam. Once the stability E % of pulse energy of the laser beam is calculated, the laser control unit 30 may end the process according to this flowchart and proceed to S800 shown in FIG. 12.

3.5 Fifth Example of Control

Figure 14:
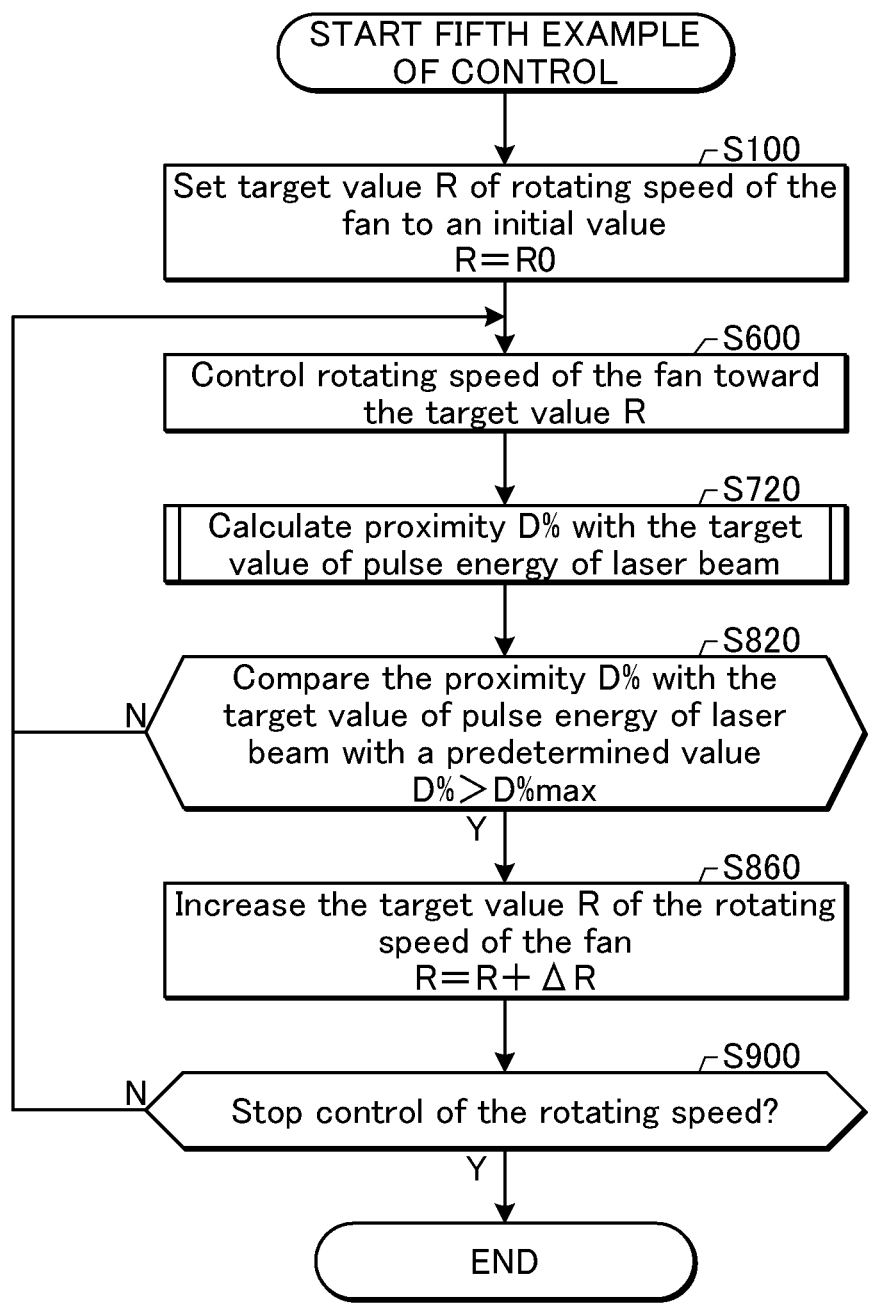
FIG. 14 is a flowchart illustrating a fifth example of controlling the rotating speed of the fan according to the present disclosure.

FIG. 14 is a flowchart illustrating a fifth example of controlling the rotating speed of the fan according to the present disclosure. The process shown in FIG. 14 may be performed by the laser control unit 30 (FIG. 1) in the excimer laser apparatus according to the first embodiment.

The fifth example of control may differ from the first example of control shown in FIG. 3 in terms of repeating the process for increasing the rotating speed of the fan when the discharge becomes unstable (S720, S820, S860). The process for calculating the electrode gap G or calculating the target value R of the rotating speed of the fan from the electrode gap G (S400, S500) shown in FIG. 3 is not necessary here.

The fifth example of control may differ from the fourth example of control shown in FIG. 12 in terms of calculating a proximity D % with the target value of the pulse energy of the laser beam (S720) and comparing the proximity D % with a predetermined value D % max (S820).

Details of the process of S720 will be described below with reference to FIG. 15.

In S820, the predetermined value D % max may be a threshold falling within an allowable range regarding the proximity D % with the target value of the pulse energy of the laser beam. In a case where the proximity D % with the target value of the pulse energy of the laser beam is equal to or less than the predetermined value D % max (S820; NO), the laser control unit 30 may return to S600. In a case where the proximity D % with the target value of the pulse energy of the laser beam exceeds the predetermined value D % max (S820; YES), the laser control unit 30 may proceed to S860.

In other respects, the fifth example of control may be identical to the fourth example of control.

Figure 15:
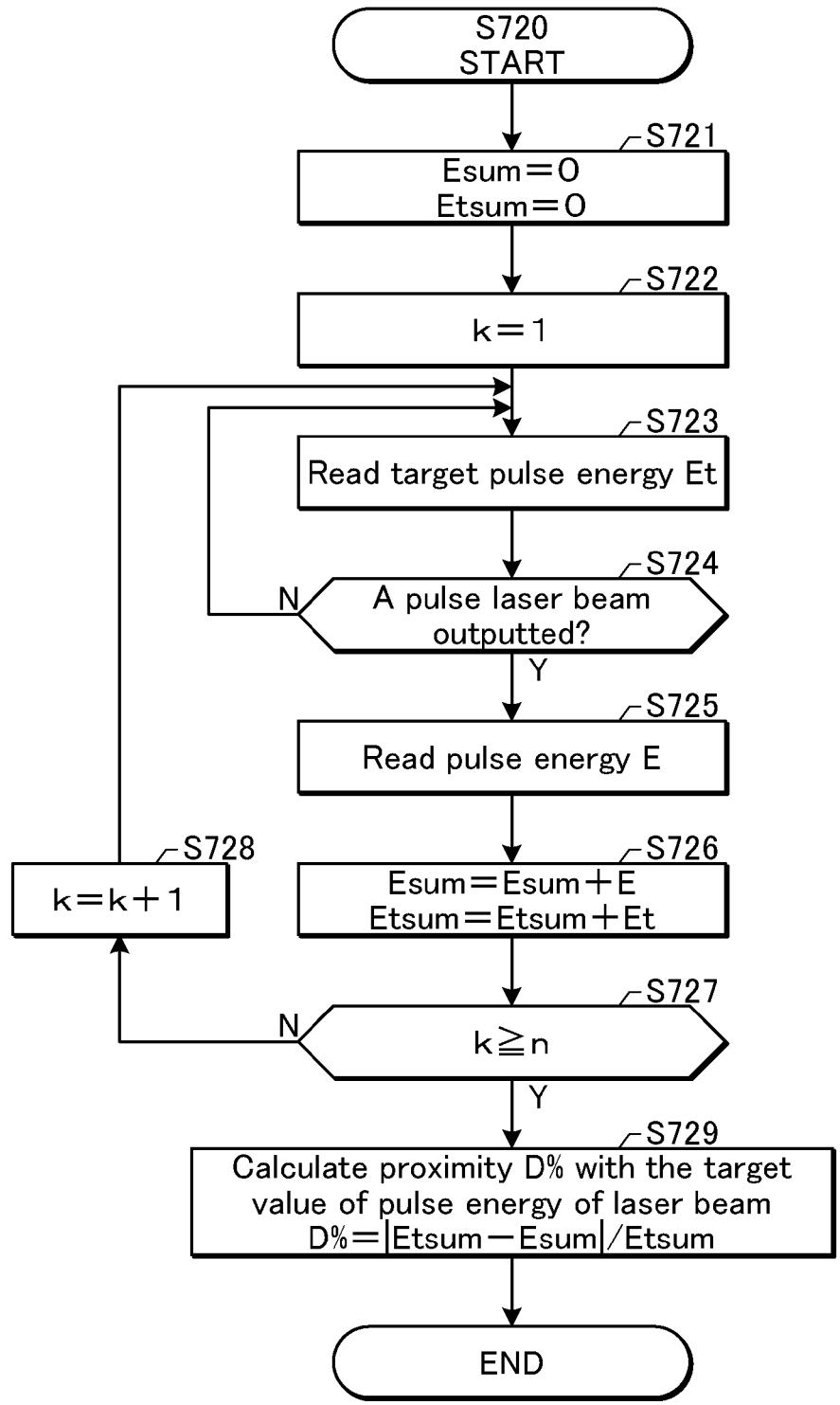
FIG. 15 is a flowchart illustrating a process for calculating proximity with a target value of pulse energy of a laser beam shown in FIG. 14.

FIG. 15 is a flowchart illustrating the process for calculating the proximity D % with the target value of the pulse energy of the laser beam shown in FIG. 14. The process shown in FIG. 15 may be performed by the laser control unit 30 (FIG. 1) as a subroutine of S720 shown in FIG. 14. The proximity D % with the target value of the pulse energy of the laser beam may be calculated on the basis of the data representing the pulse energy E received from the pulse energy measurement unit 17.

First, the laser control unit 30 may set both the values of variables Esum and Etsum to an initial value 0 (S721).

Next, the laser control unit 30 may set a counter k to 1 (S722). The counter k may be a natural value.

Next, the laser control unit 30 may read the value of a target pulse energy Et of the laser beam (S723). The value of the target pulse energy Et may for example be a value that is requested by the exposure device control unit 110.

Next, the laser control unit 30 may determine whether a pulse laser beam has been outputted (S724). The pulse laser beam may be a laser beam of one pulse. The determination as to whether the pulse laser beam has been outputted may be made, for example, on the basis of whether data representing a pulse energy E has been received from the pulse energy measurement unit 17. In a case where no pulse laser beam is outputted (S724: NO), the laser control unit 30 may return to the aforementioned S723.

In a case where the pulse laser beam has been outputted (S724: YES), the laser control unit 30 may read the data representing the pulse energy E received from the pulse energy measurement unit 17 (S725).

Next, the laser control unit 30 may update the value of the variable Esum by adding the value of the pulse energy E to the current value of the variable Esum. Further, the laser control unit 30 may update the value of the variable Etsum by adding the value of the target pulse energy Et to the value of the variable Etsum (S726).

Next, the laser control unit 30 may determine whether the value of the counter k has reached a constant value n (S727). The constant value n may be the number of samples of the pulse energy E that is used for calculating the proximity D % with the target value of the pulse energy of the laser beam. The constant value n may for example be 30 or greater and 100 or less.

In a case where the value of the counter k has not reached the constant value n (S727; NO), the laser control unit 30 may add 1 to the value of the counter k (S728) and return to the aforementioned S723.

In a case where the value of the counter k has reached the constant value n (S727; YES), the laser control unit 30 may proceed to S729.

In S729, the laser control unit 30 may calculate the proximity D % with the target value of the pulse energy of the laser beam on the basis of the value of the variable Esum and the value of the variable Etsum according to the following equation:

$$D\% = |Etsum - Esum|/Etsum \times 100$$

The degree of wearing out of the pair of electrodes 11a and 11b may be determined by the proximity D % with the target value of the pulse energy of the laser beam. Once the proximity D % with the target value of the pulse energy of the laser beam is calculated, the laser control unit 30 may end the process according to this flowchart and proceed to S820 shown in FIG. 14.

4. Excimer Laser Apparatus Including Electrode Moving Mechanisms (Second Embodiment)

4.1 Configuration

Figure 16:
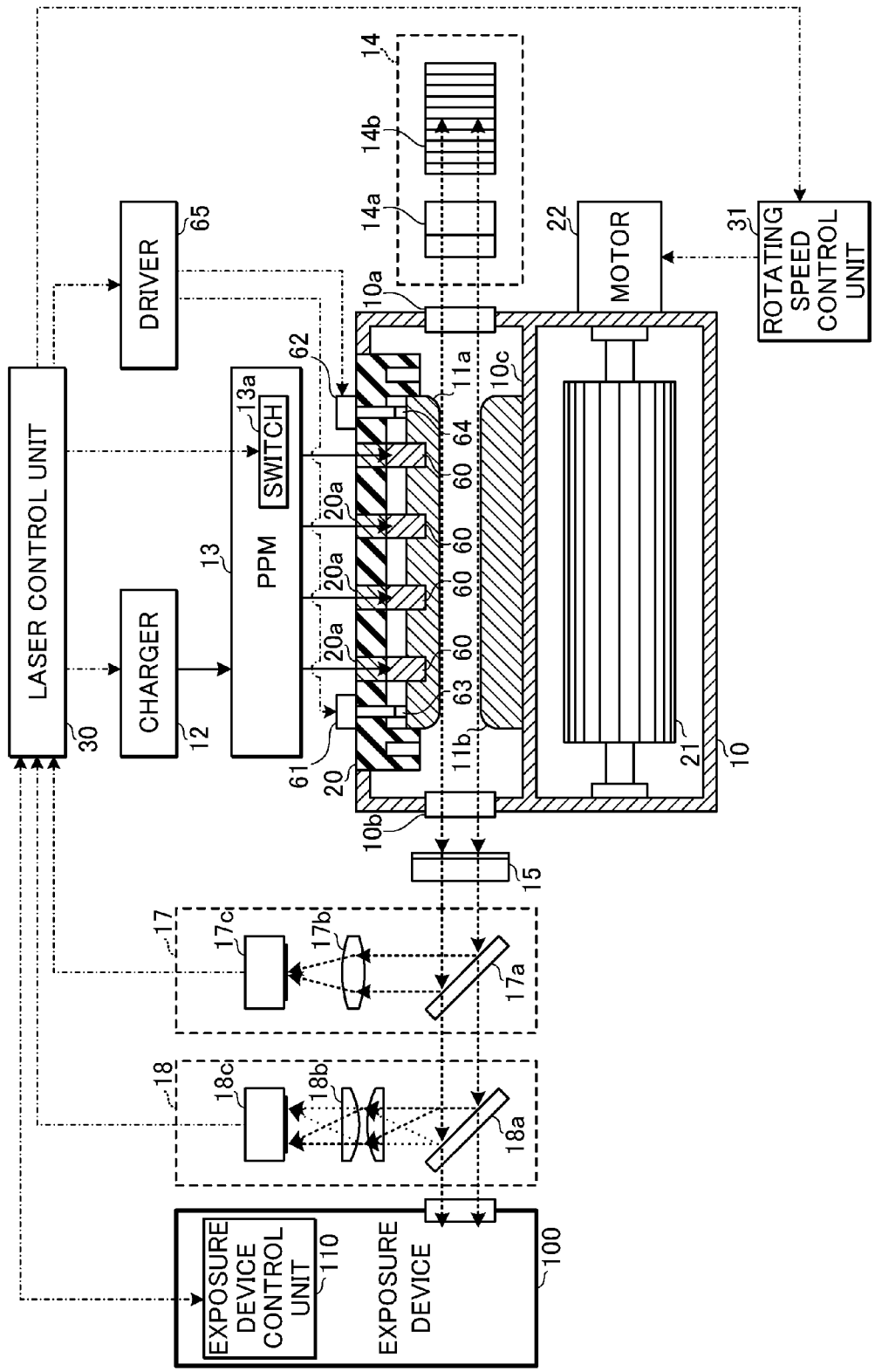
FIG. 16 schematically illustrates a configuration of an excimer laser apparatus according to a second embodiment.
Figure 17:
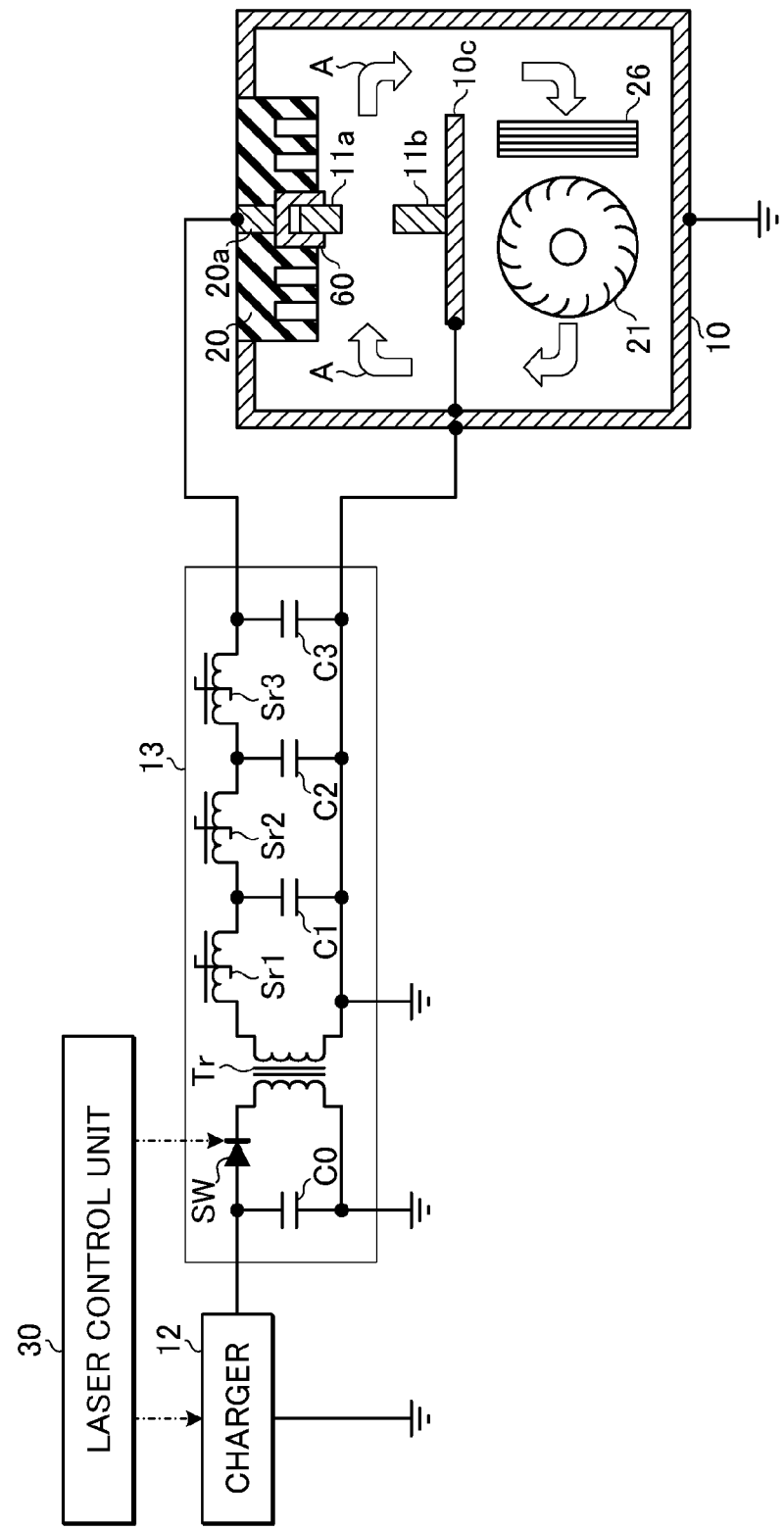
FIG. 17 shows an internal configuration of a laser chamber shown in FIG. 16 and a configuration of a pulse power module shown in FIG. 16.

FIG. 16 schematically illustrates a configuration of an excimer laser apparatus according to a second embodiment. FIG. 17 shows an internal configuration of a laser chamber 10 shown in FIG. 16 and a configuration of a pulse power module 13 shown in FIG. 16. As shown in FIGS. 16 and 17, the excimer laser apparatus may include a plurality of connectors 60, electrode moving mechanisms 61 and 62, insulators 63 and 64, and a driver 65. These components may be configured to enable a first one of the electrodes, i.e., the electrode 11a, to move toward a second one of the electrodes, i.e., the electrode 11b. In other respects, the second embodiment may be identical in configuration to the first embodiment described with reference to FIGS. 2 and 3.

As shown in FIGS. 16 and 17, the plurality of connectors 60 may be electrically connected to a plurality of electric conductors 20a, respectively, and fixed to the plurality of electric conductors 20a, respectively.

As shown in FIG. 16, the electrode moving mechanisms 61 and 62 may be fixed to the electric insulator 20.

Figure 18:
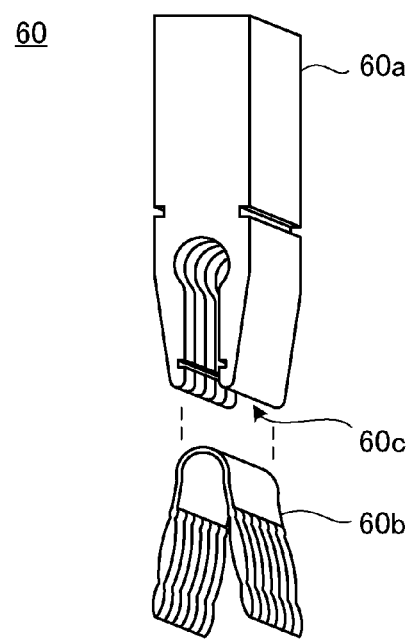
FIG. 18 illustrates in detail a configuration of a connector shown in FIG. 16.

FIG. 18 illustrates in detail a configuration of each of the connectors 60 shown in FIG. 16. Each of the connectors 60 may include a rod member 60a and a plate spring member 60b. A groove 60c may be formed at one end of the rod member 60a. The plate spring member 60b may be inserted in the groove 60c and held by the rod member 60a.

The electrode 11a may be held in the groove 60c by the plate spring member 60b while being pinched by the plate spring member 60b. The electrode 11a may be movable relative to the plate spring member 60b and the rod member 60a when subjected to external force that is equal to or higher than gravity and acts vertically in FIG. 18. The rod member 60a and the plate spring member 60b may both have electric conductivity and enable a high voltage that is supplied from the pulse power module 13 to be applied to the electrode 11a.

Figure 19:
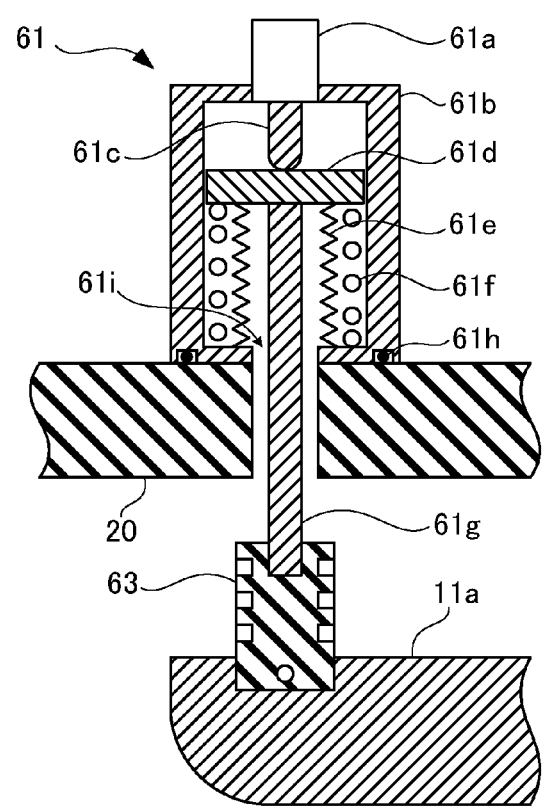
FIG. 19 illustrates in detail a configuration of an electrode moving mechanism and an insulator shown in FIG. 16.

FIG. 19 illustrates in detail a configuration of the electrode moving mechanism 61 shown in FIG. 16 and the insulator 63 shown in FIG. 16. The electrode moving mechanism 62 and the insulator 64 may be configured in the same manner. The electrode moving mechanism 61 may include a micrometer head 61a, a cylinder 61b, a spindle 61c, a piston 61d, a flexible tube 61e, a spring 61f, and a shaft 61g.

The cylinder 61b may be fixed to the electric insulator 20. An O-ring 61h may be disposed on a surface of contact between the cylinder 61b and the electric insulator 20 to keep the surface of contact between the cylinder 61b and the electric insulator 20 in a hermetic state.

The piston 61d may be provided so as to be movable inside the cylinder 61b. The shaft 61g may have a first end fixed to the piston 61d inside the cylinder 61b. The shaft 61g may pass through an opening 61i of the cylinder 61b and a through-hole of the electric insulator 20 and be movable along the through-hole of the electric insulator 20. The shaft 61g may have a second end located on a side opposite to the cylinder 61b with respect to the electric insulator 20 and fixed to the insulator 63. The insulator 63 may be fixed to the electrode 11a.

The shaft 61g may be inserted in the flexible tube 61e disposed inside the cylinder 61b. The flexible tube 61e may have a first end sealed with the piston 61d and a second end sealed with the periphery of the opening 61i of the cylinder 61b. This may allow the through-hole of the electric insulator 20 to be hermetically sealed with the flexible tube 61e and the piston 61d.

The spring 61f may be disposed inside the cylinder 61b so as to surround the flexible tube 61e. The piston 61d may be subjected to a repulsive force of the spring 61f in a direction away from the electric insulator 20.

The micrometer head 61a may be fixed to the cylinder 61b. The micrometer head 61a may be driven via the driver 65 by the laser control unit 30 shown in FIG. 16. This may configure the micrometer head 61a to cause the spindle 61c located inside the cylinder 61b to move in a direction toward the electric insulator 20. The spindle 61c may push the piston 61d against the repulsive force of the spring 61f.

This configuration may allow the electrode moving mechanism 61 to move the electrode 11a toward a lower position in FIG. 19, i.e., in a direction substantially parallel to the direction of discharge.

4.2 Sixth Example of Control

Figure 20:
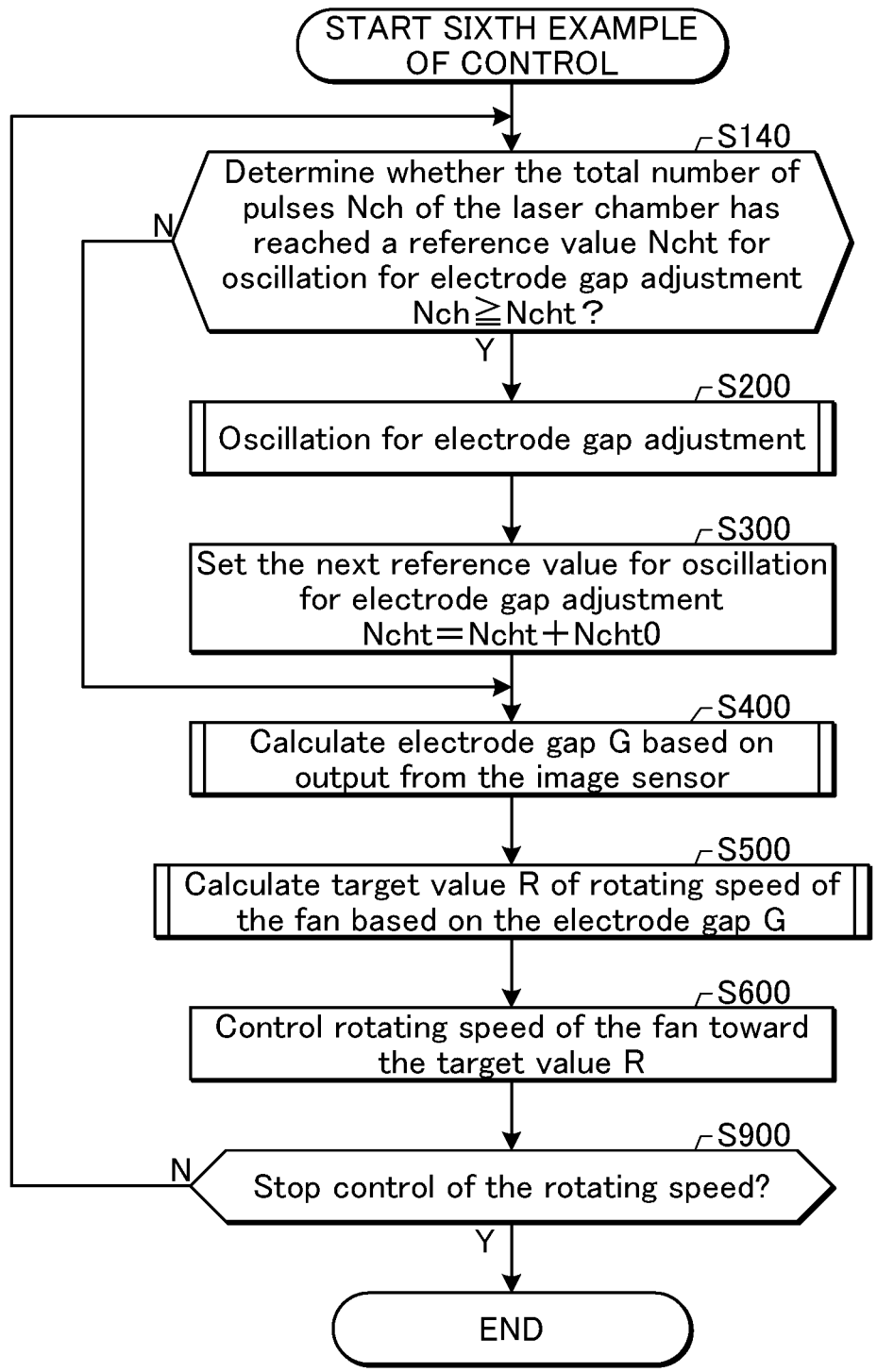
FIG. 20 is a flowchart illustrating a sixth example of controlling the rotating speed of the fan according to the present disclosure.

FIG. 20 is a flowchart illustrating a sixth example of controlling the rotating speed of the fan according to the present disclosure. The process shown in FIG. 20 may be performed by the laser control unit 30 (FIG. 16) in the excimer laser apparatus according to the second embodiment.

The sixth example of control may differ from the first example of control shown in FIG. 3 in terms of including a process (S140, S200, S300) for adjusting the electrode gap G on the basis of the result of calculation of the electrode gap G. In other respects, the sixth example of control may be identical to the first example of control.

First, the laser control unit 30 may determine whether the total number of pulses Nch of the laser chamber has reached a reference value Ncht for oscillation for electrode gap adjustment (S140). The total number of pulses Nch of the laser chamber may be the one calculated by the process shown in the aforementioned FIG. 10B.

In a case where the total number of pulses Nch of the laser chamber has not reached the reference value Ncht for oscillation for electrode gap adjustment (S140; NO), the laser control unit 30 may proceed to S400. In a case where the total number of pulses Nch of the laser chamber has reached the reference value Ncht for oscillation for electrode gap adjustment (S140; YES), the laser control unit 30 may proceed to S200.

In S200, the laser control unit 30 may perform oscillation for electrode gap adjustment. In the oscillation for electrode gap adjustment, the electrode gap G may be adjusted on the basis of the result of calculation of the electrode gap G. The adjustment of the electrode gap G may be intended to move the electrode 11a to compensate for an increase in the electrode gap G due to the wearing out of the electrodes. Details of this process will be described below with reference to FIG. 21.

Next, the laser control unit 30 may set the next reference value for oscillation for electrode gap adjustment by updating the reference value Ncht for oscillation for electrode gap adjustment (S300). The next reference value for oscillation for electrode gap adjustment may be a value obtained by adding a constant value Ncht0 to the current reference value Ncht for oscillation for electrode gap adjustment.

After S300, the laser control unit 30 may proceed to S400.

In the sixth example of control, as in the first example of control, the rotating speed of the fan may be controlled on the basis of the result of calculation of the electrode gap G by the process of S400 to S600. However, the electrode gap G may be adjusted on the basis of the result of measurement of the electrode gap G every time the total number of pulses Nch of the laser chamber reaches the reference value Ncht for oscillation for electrode gap adjustment.

Figure 21:
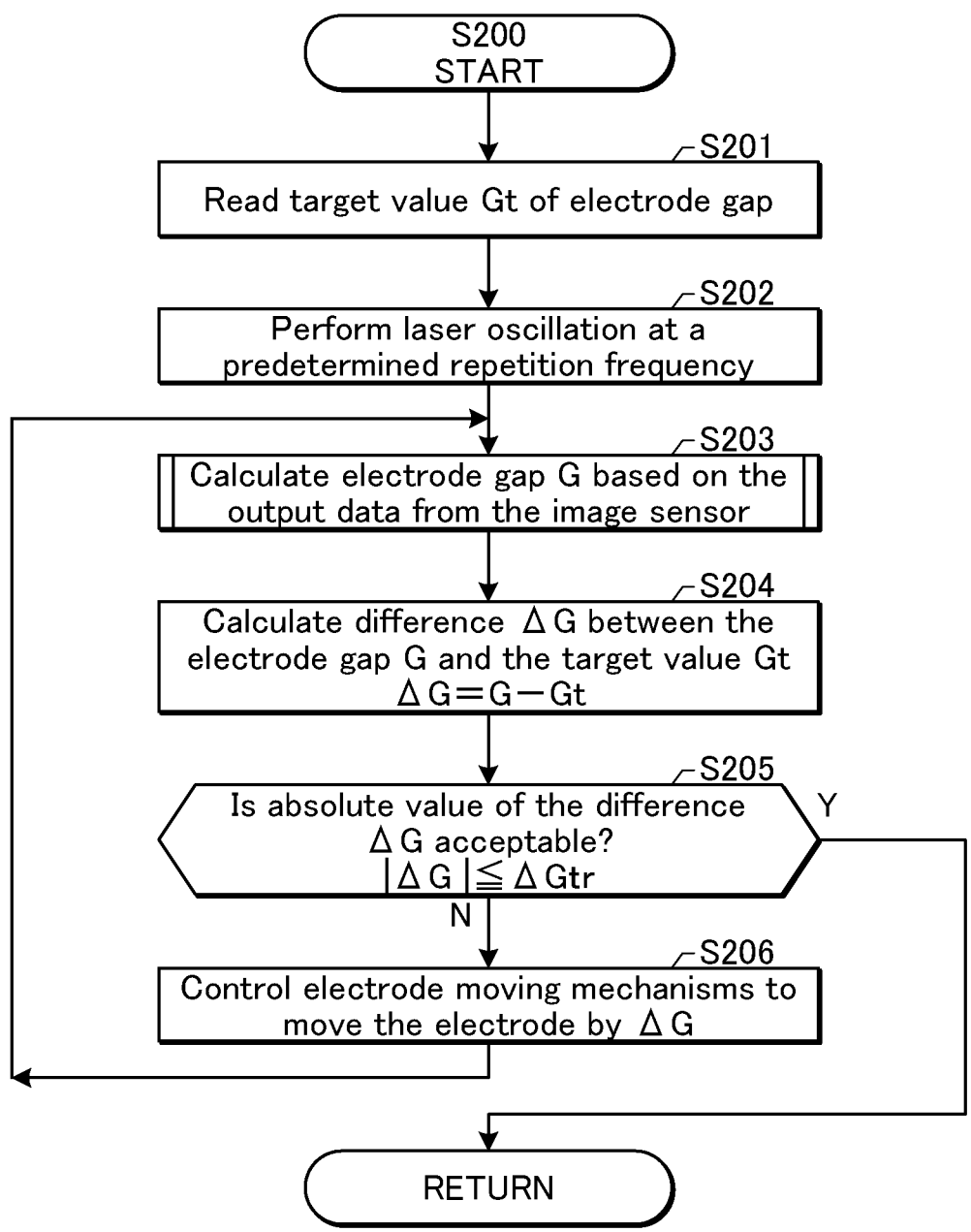
FIG. 21 is a flowchart illustrating an example of a process of oscillation for electrode gap adjustment shown in FIG. 20.

FIG. 21 is a flowchart illustrating an example of the process of oscillation for electrode gap adjustment shown in FIG. 20. The process shown in FIG. 21 may be performed by the laser control unit 30 as a subroutine of S200 shown in FIG. 20.

The laser control unit 30 may read a target value Gt of the electrode gap from the after-mentioned memory (S201).

Next, the laser control unit 30 may send various signals to the charger 12 and the pulse power module 13 so that the excimer laser apparatus performs laser oscillation at a predetermined repetition frequency (S202).

Next, the laser control unit 30 may calculate the electrode gap G on the basis of the output from the image sensor 18c of the beam profile measurement unit 18 (S203). This process may be identical to that described with reference to FIGS. 4A and 4B.

Next, the laser control unit 30 may calculate a difference $\Delta G$ between the electrode gap G thus calculated and the aforementioned target value Gt according to the following equation (S204):

$$\Delta G = G - Gt.$$

Next, the laser control unit 30 may compare the absolute value $|\Delta G|$ of the difference $\Delta G$ thus calculated with a predetermined value $\Delta Gtr$ (S205). The predetermined value $\Delta Gtr$ may be a threshold falling within an allowable range regarding the difference $\Delta G$ between the electrode gap G and the target value Gt.

In a case where the aforementioned absolute value $|\Delta G|$ exceeds the predetermined value $\Delta Gtr$ (S205; NO), the laser control unit 30 may control the electrode moving mechanisms 61 and 62 (FIG. 16) via the driver 65 to move the electrode 11a by $\Delta G$ (S206). After S206, the laser control unit 30 may return to the aforementioned S203 to recalculate the electrode gap G.

In a case where the aforementioned absolute value $|\Delta G|$ is equal to or less than the predetermined value $\Delta Gtr$ (S205; YES), the laser control unit 30 may end the process according to this flowchart and proceed to S300 shown in FIG. 20, without controlling the electrode moving mechanisms 61 and 62.

4.3 Seventh Example of Control

Figure 22:
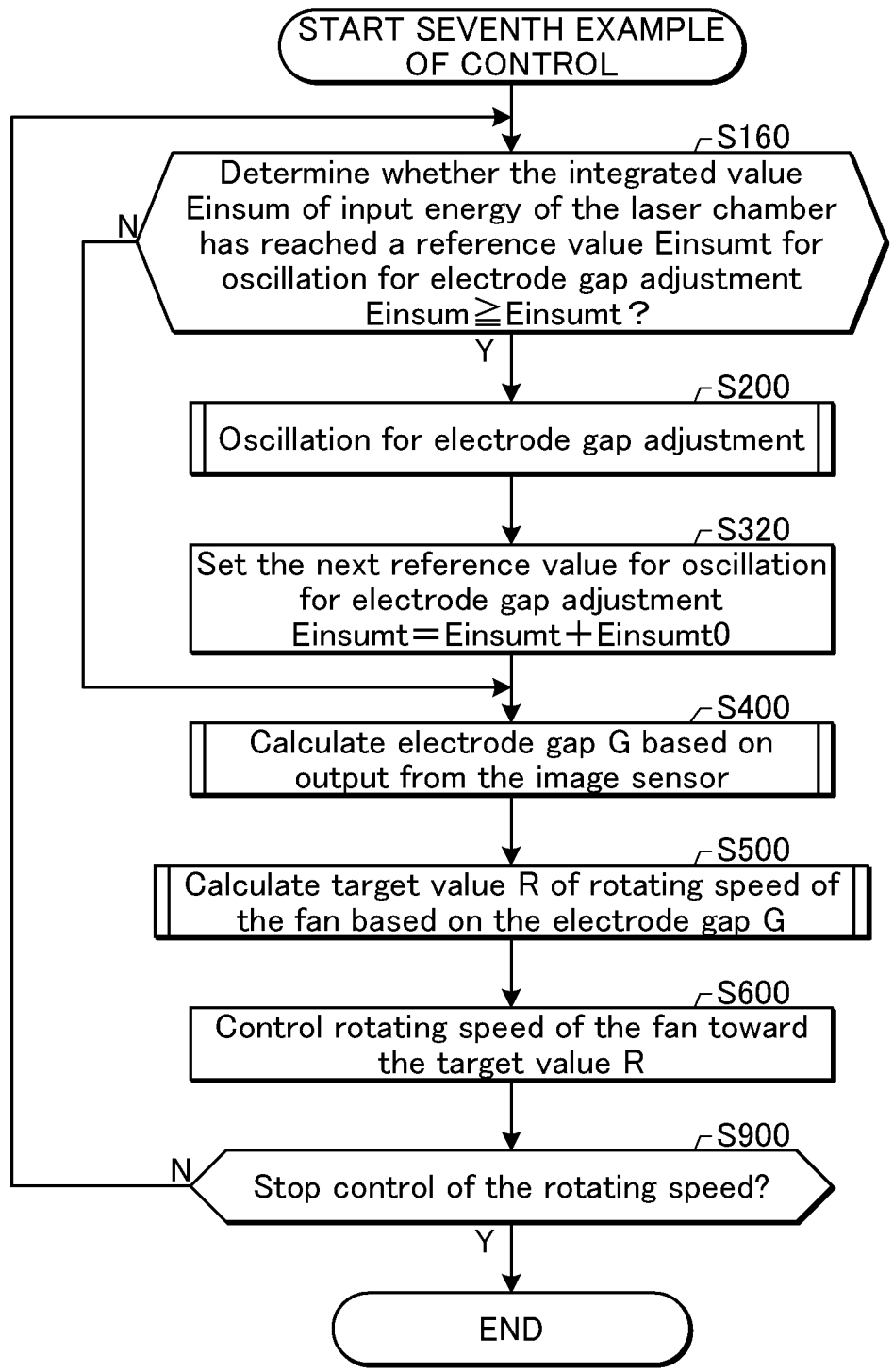
FIG. 22 is a flowchart illustrating a seventh example of controlling the rotating speed of the fan according to the present disclosure.

FIG. 22 is a flowchart illustrating a seventh example of controlling the rotating speed of the fan according to the present disclosure. The process shown in FIG. 22 may be performed by the laser control unit 30 (FIG. 16) in the excimer laser apparatus according to the second embodiment.

The seventh example of control may differ from the first example of control shown in FIG. 3 in terms of including a process (S160, S200, S320) for adjusting the electrode gap G on the basis of the result of calculation of the electrode gap G. In other respects, the seventh example of control may be identical to the first example of control.

The seventh example of control may differ from the sixth example of control shown in FIG. 20 in terms of determining a reference value for oscillation for electrode gap adjustment on the basis of the integrated value Einsum of input energy of the laser chamber (S160, S320). In other respects, the seventh example of control may be identical to the sixth example of control.

First, the laser control unit 30 may determine whether the integrated value Einsum of input energy of the laser chamber has reached a reference value Einsumt for oscillation for electrode gap adjustment (S160). The integrated value Einsum of input energy of the laser chamber may be the one calculated by the process shown in the aforementioned FIG. 11B.

In a case where the integrated value Einsum of input energy of the laser chamber has not reached the reference value Einsumt for oscillation for electrode gap adjustment (S160; NO), the laser control unit 30 may proceed to S400. In a case where the integrated value Einsum of input energy of the laser chamber has reached the reference value Einsumt for oscillation for electrode gap adjustment (S160; YES), the laser control unit 30 may proceed to S200.

In S200, the laser control unit 30 may perform oscillation for electrode gap adjustment. This process may be identical to the process of S200 described with reference to FIGS. 20 and 21.

Next, the laser control unit 30 may set the next reference value for oscillation for electrode gap adjustment by updating the reference value Einsumt for oscillation for electrode gap adjustment (S320). The next reference value for oscillation for electrode gap adjustment may be a value obtained by adding a constant value Einsumt0 to the current reference value Einsumt for oscillation for electrode gap adjustment.

After S320, the laser control unit 30 may proceed to S400.

In the seventh example of control, as in the first example of control, the rotating speed of the fan may be controlled on the basis of the result of calculation of the electrode gap G by the process of S400 to S600. However, the electrode gap G may be adjusted on the basis of the result of calculation of the electrode gap G every time the integrated value Einsum of input energy of the laser chamber reaches the reference value Einsumt for oscillation for electrode gap adjustment.

4.4 Eighth Example of Control

Figure 23:
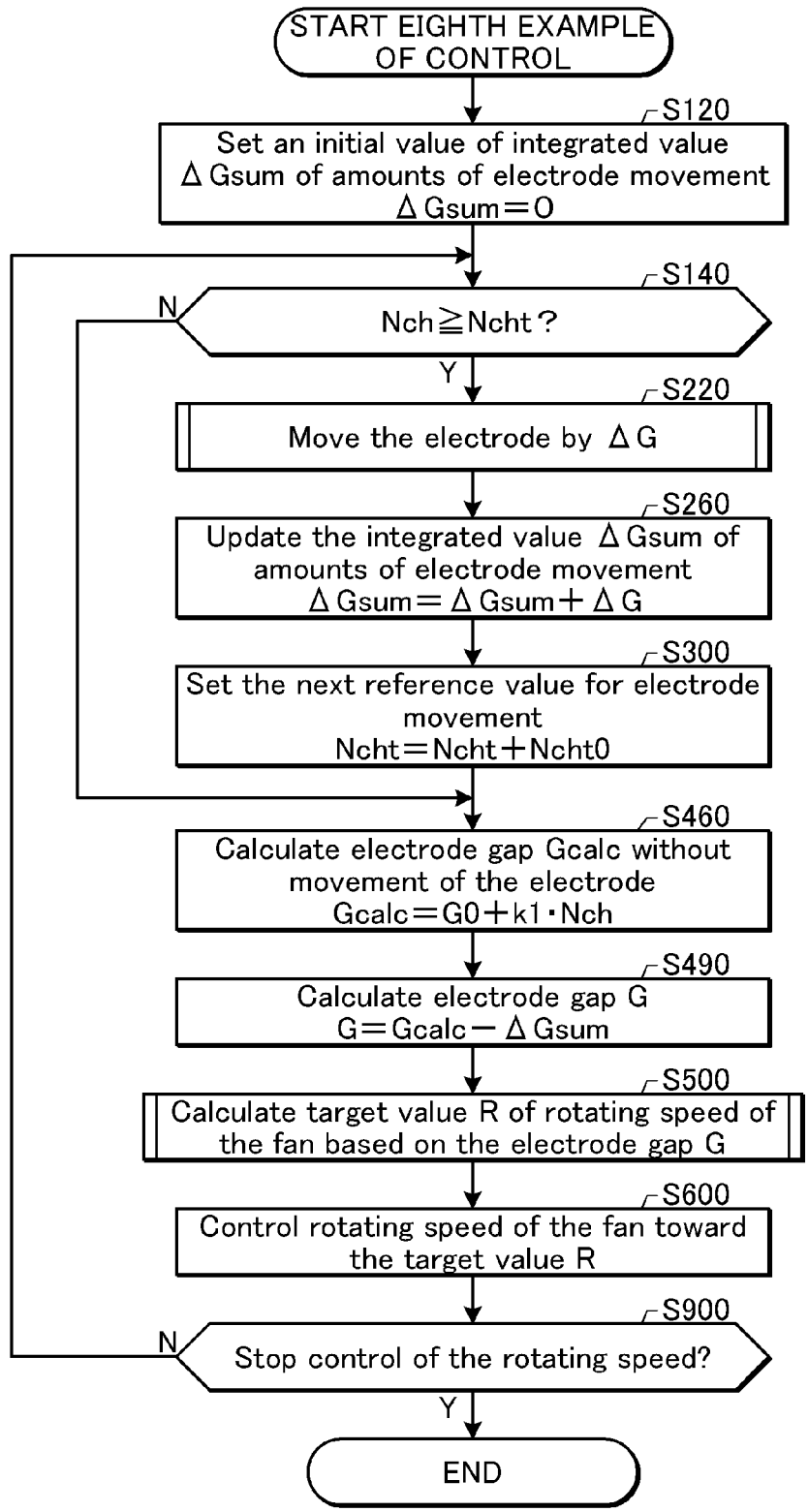
FIG. 23 is a flowchart illustrating an eighth example of controlling the rotating speed of the fan according to the present disclosure.

FIG. 23 is a flowchart illustrating an eighth example of controlling the rotating speed of the fan according to the present disclosure. The process shown in FIG. 23 may be performed by the laser control unit 30 (FIG. 16) in the excimer laser apparatus according to the second embodiment.

In the eighth example of control, the electrode gap G may be calculated on the basis of the wear-out parameter of the pair of electrodes 11a and 11b, and the electrode 11a may be moved (S220). Further, in the eighth example of control, an integrated value ΔGsum of amounts of electrode movement may be stored in advance and used for the subsequent calculation of the electrode gap G (S120, S260, S460, S490). In these respects, the eighth example of control may differ from the sixth example of control shown in FIG. 20. In other respects, the eighth example of control may be identical to the sixth example of control.

First, the laser control unit 30 may set an initial value of the integrated value ΔGsum of amounts of electrode movement to 0 (S120). The integrated value ΔGsum of amounts of electrode movement may be updated every time the electrode 11a is moved (S260), and may be used for the subsequent calculation of the electrode gap G (S490).

Next, the laser control unit 30 may determine whether the total number of pulses Nch of the laser chamber has reached a reference value Ncht for electrode movement (S140). The total number of pulses Nch of the laser chamber may be the one calculated by the process shown in the aforementioned FIG. 10B.

In a case where the total number of pulses Nch of the laser chamber has not reached the reference value Ncht for electrode movement (S140; NO), the laser control unit 30 may proceed to S460. In a case where the total number of pulses Nch of the laser chamber has reached the reference value Ncht for electrode movement (S140; YES), the laser control unit 30 may proceed to S220.

In S220, the laser control unit 30 may move the electrode 11a. An amount of electrode movement ΔG may be calculated on the basis of the wear-out parameter of the pair of electrodes 11a and 11b. Details of this process will be described below with reference to FIG. 24.

Next, the laser control unit 30 may update the integrated value ΔGsum of amounts of electrode movement (S260). The integrated value of amounts of electrode movement may be a value obtained by adding the amount of electrode movement ΔG in S220 to the current integrated value ΔGsum of amounts of electrode movement.

Next, the laser control unit 30 may set the next reference value for electrode movement by updating the reference value Ncht for electrode movement (S300). The next reference value for electrode movement may be a value obtained by adding a constant value Ncht0 to the current reference value Ncht for electrode movement.

After S300, the laser control unit 30 may proceed to S460.

In S460, the laser control unit 30 may calculate an electrode gap Gcalc without movement of the electrode 11a. The electrode gap Gcalc without movement of the electrode 11a may for example be calculated on the basis of the wear-out parameter of the pair of electrodes 11a and 11b according to the following equation:

$$Gcalc = G0 + k1 \cdot Nch,$$

where G0 may be an initial value of the electrode gap and k1 may be a positive number that is used as a constant of proportionality. The total number of pulses Nch of the laser chamber may be the one calculated by the process shown in the aforementioned FIG. 10B.

Next, the laser control unit 30 may calculate the electrode gap G according to the following equation (S490):

$$G = Gcalc - \Delta Gsum.$$

After S490, the laser control unit 30 may proceed to S500.

In the eighth example of control, as in the first example of control, the rotating speed of the fan may be controlled on the basis of the result of calculation of the electrode gap G by the process of S500 and S600. However, the electrode 11a may be moved by ΔG every time the total number of pulses Nch of the laser chamber reaches the reference value Ncht for electrode movement.

Figure 25:
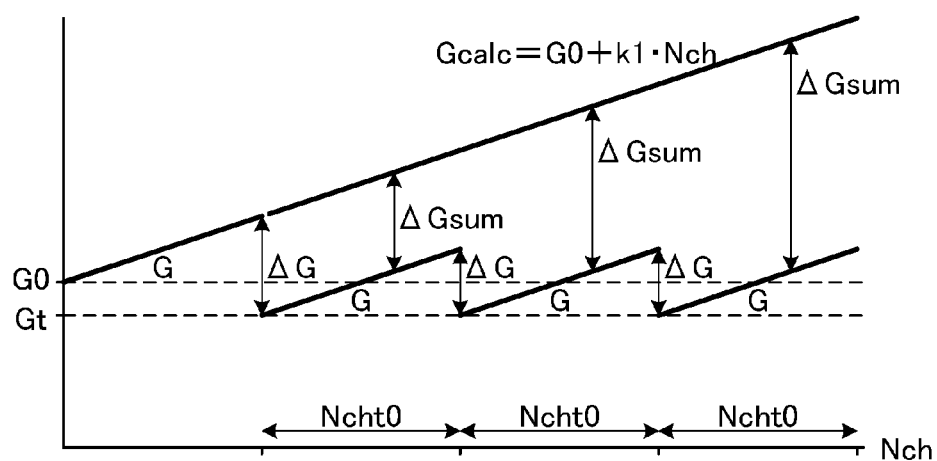
FIG. 25 is a graph illustrating changes in electrode gap according to the total number of pulses of the laser chamber.

FIG. 25 is a graph illustrating changes in the electrode gap G according to the total number of pulses Nch of the laser chamber. With the initial value G0 as a starting point, the electrode gap Gcalc without movement of the electrode 11a may increase in proportion to an increase in the total number of pulses Nch of the laser chamber. However, the electrode gap G may decrease by ΔG every time the electrode 11a is moved by ΔG. As shown in FIG. 25, the changes in the electrode gap G may be expressed in a saw-tooth form.

Figure 24:
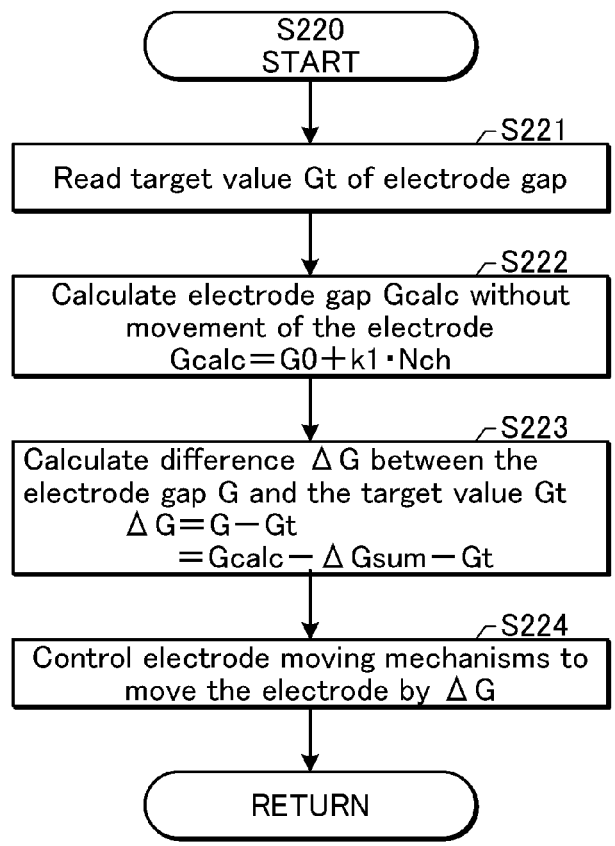
FIG. 24 is a flowchart illustrating a process for moving an electrode shown in FIG. 23.

FIG. 24 is a flowchart illustrating the process for moving an electrode shown in FIG. 23. The process shown in FIG. 24 may be performed by the laser control unit 30 as a subroutine of S220 shown in FIG. 23.

The laser control unit 30 may read the target value Gt of the electrode gap from the after-mentioned memory (S221).

Next, the laser control unit 30 may calculate the electrode gap Gcalc without movement of the electrode 11a (S222). The electrode gap Gcalc without movement of the electrode 11a may, for example, be calculated on the basis of the wear-out parameter of the pair of electrodes 11a and 11b according to the following equation:

$$Gcalc = G0 + k1 \cdot Nch,$$

where G0 may be an initial value of the electrode gap and k1 may be a positive number that is used as a constant of proportionality. The total number of pulses Nch of the laser chamber may be the one calculated by the process shown in the aforementioned FIG. 10B.

Next, the laser control unit 30 may calculate a difference ΔG between the electrode gap G and the aforementioned target value Gt according to the following equation (S223):

$$\Delta G = G - Gt.$$

The electrode gap G may be calculated according to the following equation:

$$G = G\text{calc} - \Delta G\text{sum}.$$

Therefore, the difference ΔG between the electrode gap G and the aforementioned target value Gt may be calculated according to the following equation:

$$\Delta G = G\text{calc} - \Delta G\text{sum} - Gt.$$

Next, the laser control unit 30 may control the electrode moving mechanisms 61 and 62 (FIG. 16) via the driver 65 to move the electrode 11*a* by ΔG (S224). After S224, the laser control unit 30 may end the process according this flowchart and proceed to S260 shown in FIG. 23.

FIG. 25 shows that the difference between the electrode gap G and the target value Gt is ΔG. The target value Gt may be a value that is different from or the same as the initial value G0 of the electrode gap.

4.5 Ninth Example of Control

Figure 26:
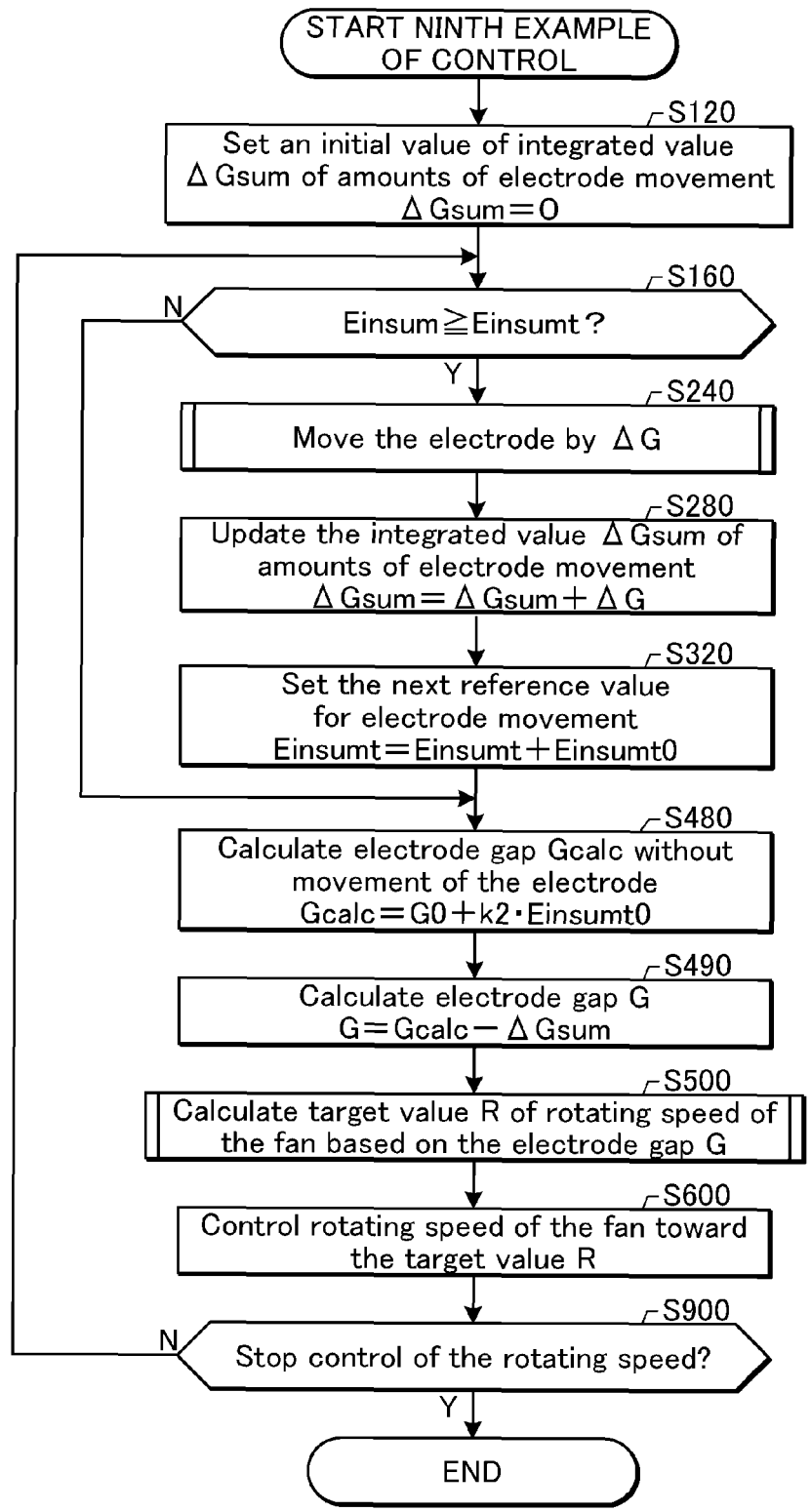
FIG. 26 is a flowchart illustrating a ninth example of controlling the rotating speed of the fan according to the present disclosure.

FIG. 26 is a flowchart illustrating a ninth example of controlling the rotating speed of the fan according to the present disclosure. The process shown in FIG. 26 may be performed by the laser control unit 30 (FIG. 16) in the excimer laser apparatus according to the second embodiment.

Figure 27:
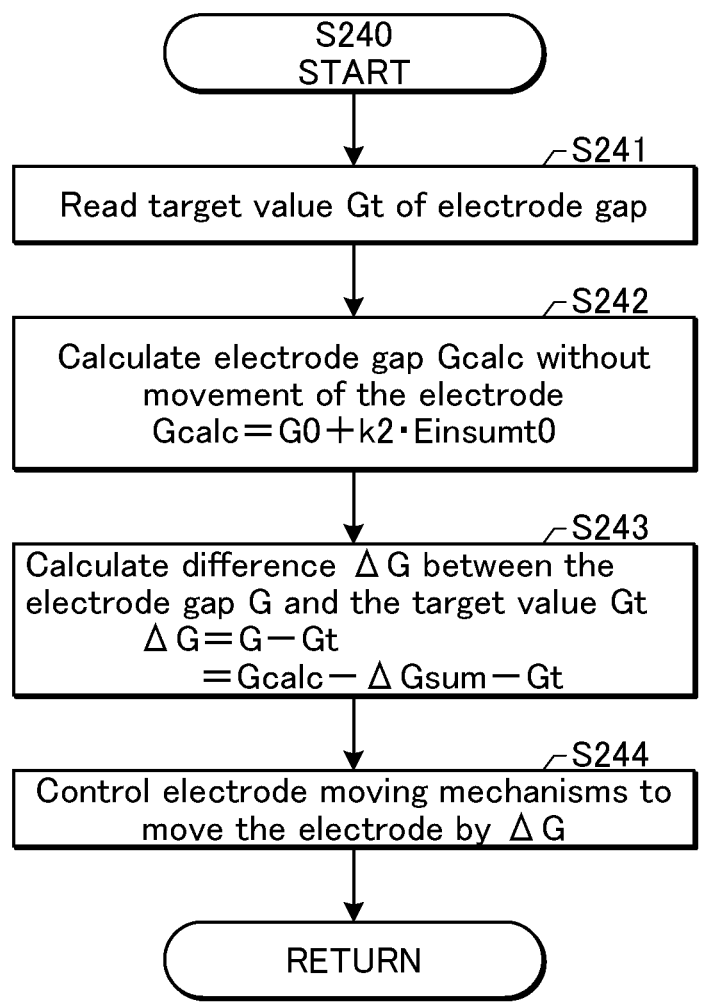
FIG. 27 is a flowchart illustrating a process for moving an electrode shown in FIG. 26.

FIG. 27 is a flowchart illustrating the process for moving an electrode shown in FIG. 26. The processes shown in FIGS. 26 and 27 may differ from the processes shown in FIGS. 23 and 24 in terms of using the integrated value Einsum of input energy of the laser chamber (S160, S320, S242, etc.). In other respects, the processes shown in FIGS. 26 and 27 may be identical to the processes shown in FIGS. 23 and 24.

5. Excimer Laser Apparatus Including Electrode Moving Mechanisms (Third Embodiment)

Figure 28:
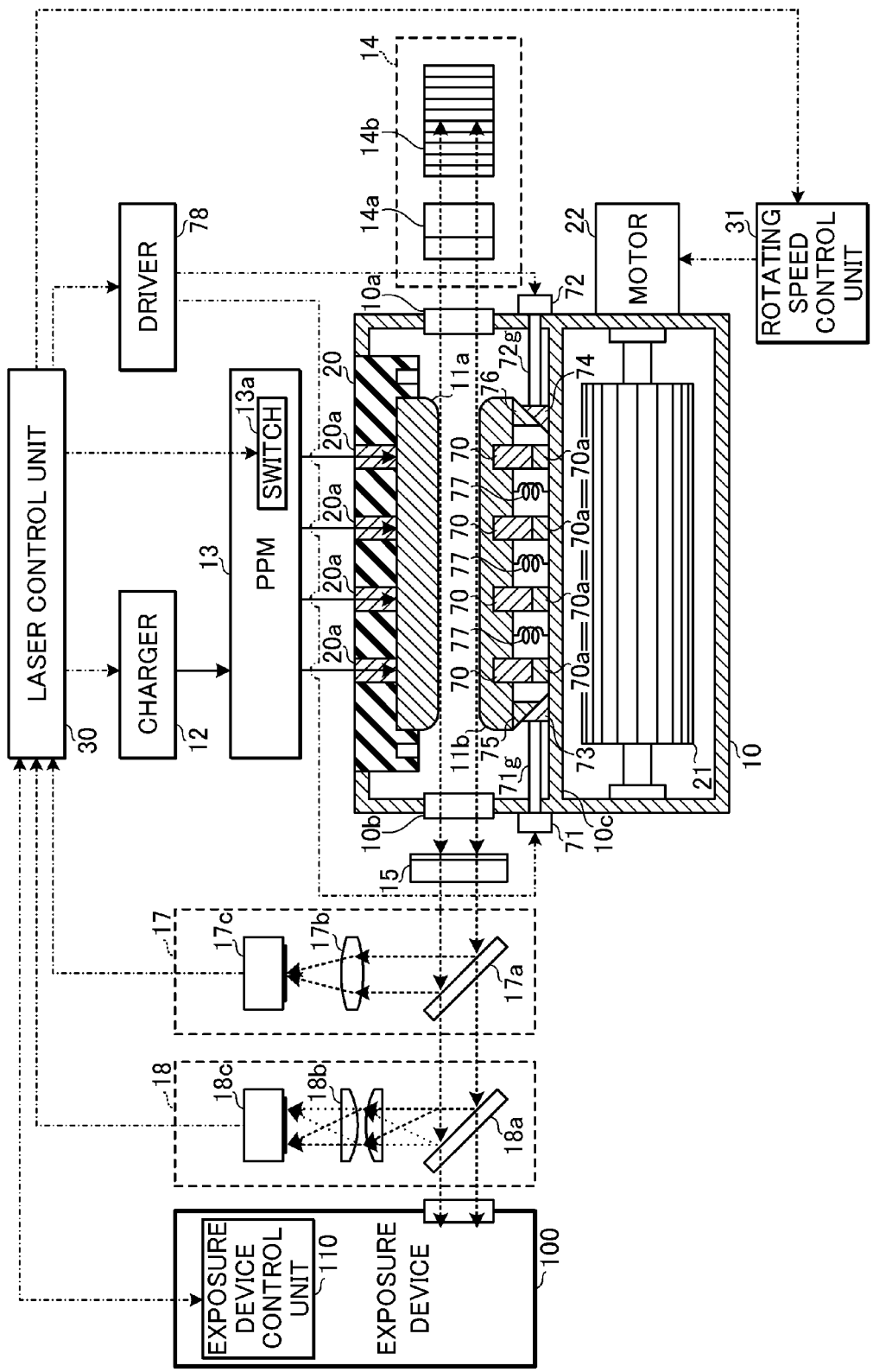
FIG. 28 schematically illustrates a configuration of an excimer laser apparatus according to a third embodiment.
Figure 29:
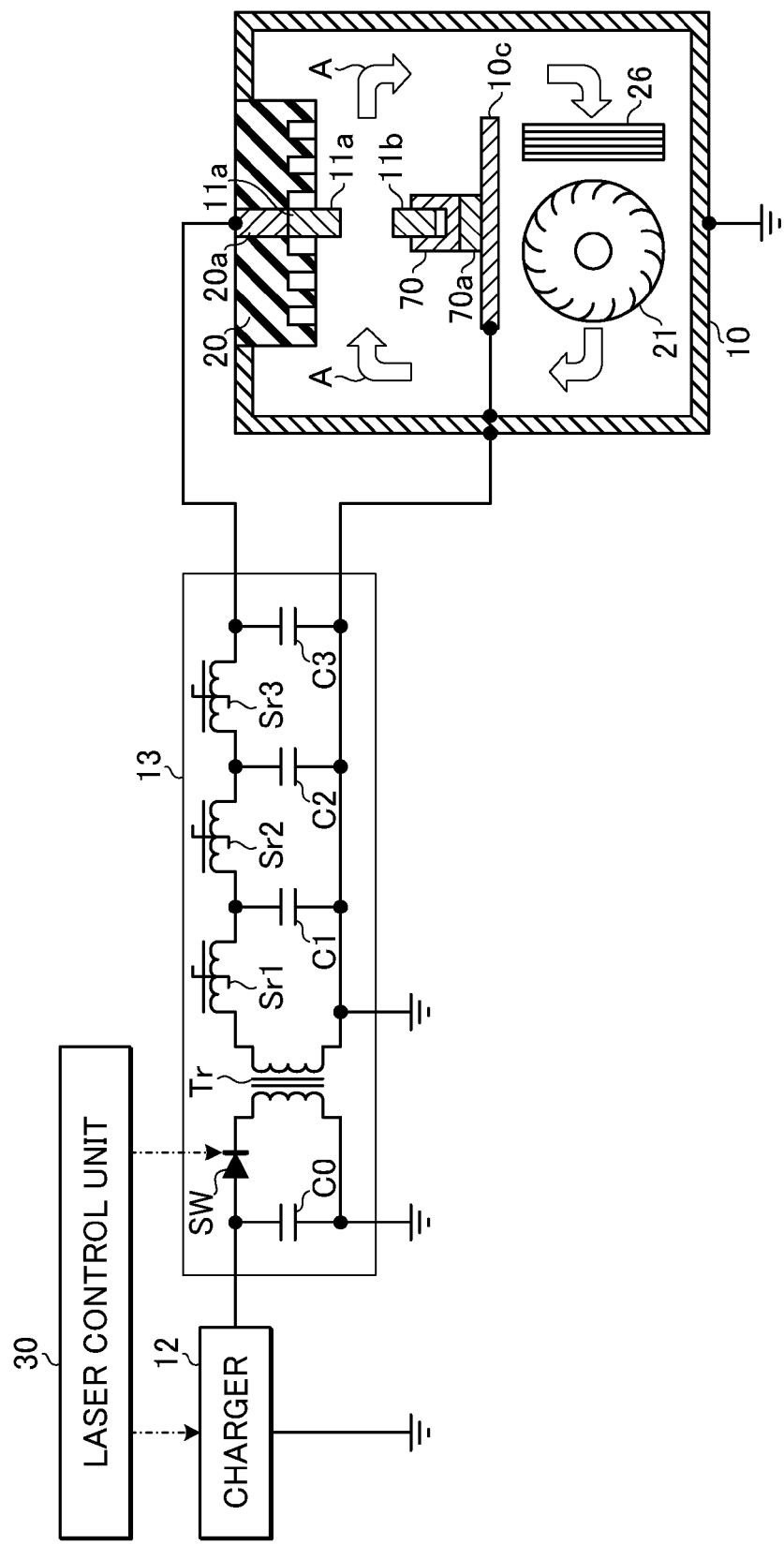
FIG. 29 shows an internal configuration of a laser chamber shown in FIG. 28 and a configuration of a pulse power module shown in FIG. 28.

FIG. 28 schematically illustrates a configuration of an excimer laser apparatus according to a third embodiment. FIG. 29 shows an internal configuration of a laser chamber 10 shown in FIG. 28 and a configuration of a pulse power module 13 shown in FIG. 28. As shown in FIGS. 28 and 29, the excimer laser apparatus may include a plurality of connectors 70, electrode moving mechanisms 71 and 72, triangular blocks 73 and 74, and a driver 78. These components may be configured to enable a first one of the electrodes, i.e., the electrode 11*b*, to move toward a second one of the electrodes, i.e., the electrode 11*a*. The connectors 60, the electrode moving mechanisms 61 and 62, or the insulators 63 and 64 are not necessary here. In other respects, the third embodiment may be identical in configuration to the second embodiment described with reference to FIGS. 16 and 17.

As shown in FIGS. 28 and 29, the connectors 70 may be electrically connected to connection terminals 70*a* and fixed to the connection terminals 70*a*. The connection terminals 70*a* may be electrically connected to the internal dividing plate 10*c* of the laser chamber 10 and fixed to the internal dividing plate 10*c*. The connectors 70 may be identical in configuration to the connectors 60 according to the second embodiment. The connectors 70 may hold the electrode 11*b* while being electrically connected to the electrode 11*b*. This may cause the electrode 11*b* to be connected to the ground potential via the connectors 70, the connection terminals 70*a*, and the internal dividing plate 10*c*.

As shown in FIGS. 28 and 29, the electrode moving mechanisms 71 and 72 may be fixed to the laser chamber 10. The electrode moving mechanisms 71 and 72 may be identical in configuration to the electrode moving mechanisms 61 and 62 according to the second embodiment. The electrode moving mechanism 71 may include a shaft 71*g*. One end of the shaft 71*g* may be located inside the laser chamber 10 and fixed to the triangular block 73. The electrode moving mechanism 72 may include a shaft 72*g*. One end of the shaft 72*g* may be located inside the laser chamber 10 and fixed to the triangular block 74. Since the electrode 11*b* is connected to the ground potential, the triangular blocks 73 and 74 may not necessarily be constituted by insulators.

Triangular blocks 75 and 76 may be fixed to the electrode 11*b*. An oblique surface of the triangular block 73 and an oblique surface of the triangular block 75 may be in contact with each other so as to be slidable over each other. An oblique surface of the triangular block 74 and an oblique surface of the triangular block 76 may be in contact with each other so as to be slidable over each other. Furthermore, one end of a spring 77 may be fixed to the electrode 11*b*. The other end of the spring 77 may be fixed to the internal dividing plate 10*c*. The electrode 11*b* may be subjected to a tensile force of the spring 77 in a direction toward the internal dividing plate 10*c*.

By the driver 78 driving the electrode moving mechanisms 71 and 72, the shafts 71*g* and 72*g* may be moved toward the center of the laser chamber 10. This may cause the triangular blocks 73 and 74 to push the triangular blocks 75 and 76, respectively, so that their oblique surfaces may slide over each other. The electrode 11*b* may be pushed by the triangular blocks 75 and 76 to move against the tensile force of the spring 77 in a direction away from the internal dividing plate 10*c*, i.e., in a direction substantially parallel to the direction of discharge.

In this way, the electrode gap may be adjusted by the electrode 11*b* being moved. The operation for adjusting the electrode gap and the operation for controlling the rotating speed of the fan may be identical to those described with reference to FIGS. 20 to 27.

6. Excimer Laser Apparatus Including Gas Supply and Exhaust Devices (Fourth Embodiment)

6.1 Configuration

Figure 30:
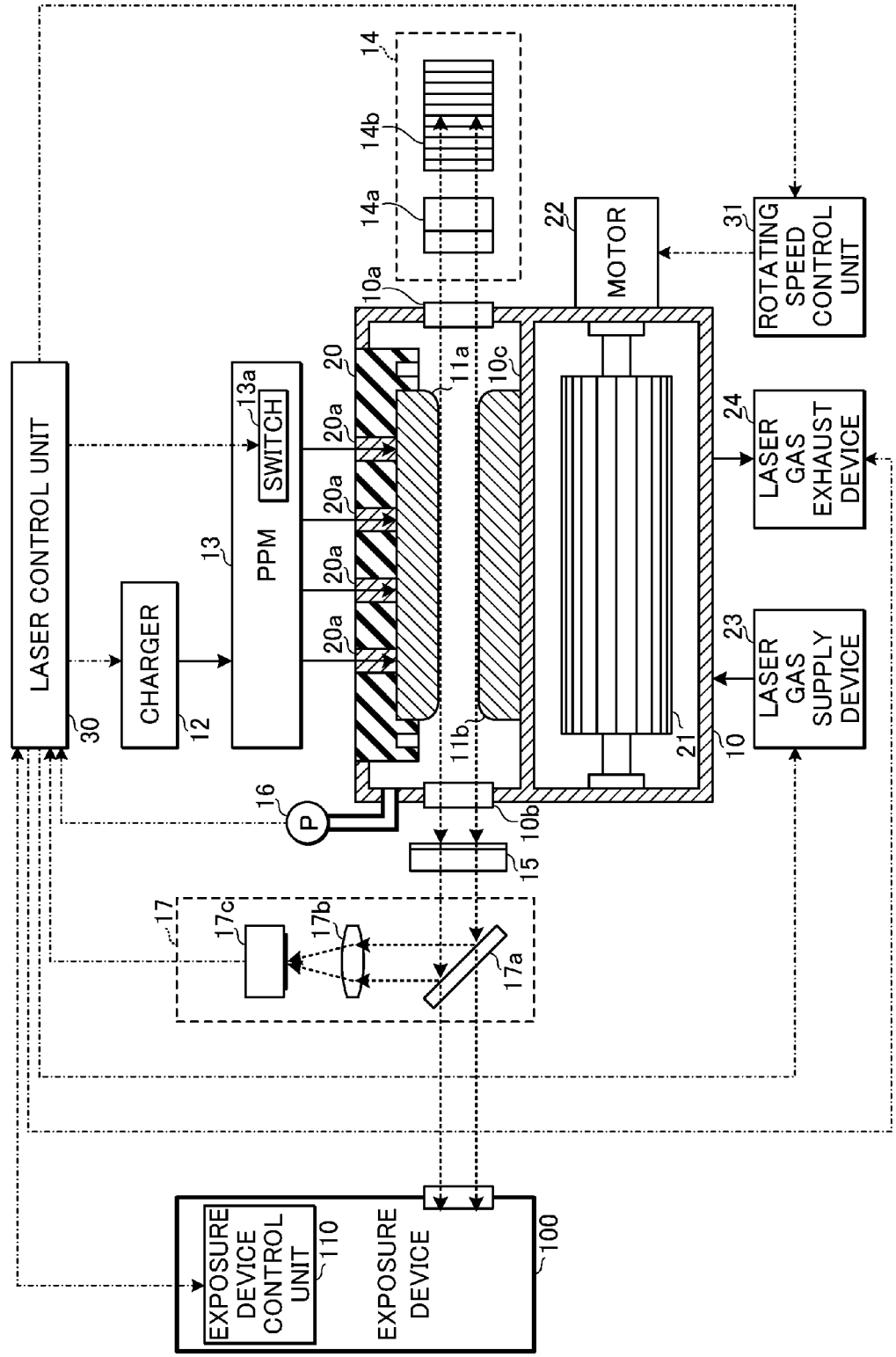
FIG. 30 schematically illustrates a configuration of an excimer laser apparatus according to a fourth embodiment.

FIG. 30 schematically illustrates a configuration of an excimer laser apparatus according to a fourth embodiment. As shown in FIG. 30, the excimer laser apparatus includes a pressure sensor 16, a laser gas supply device 23, and a laser gas exhaust device 24. The beam profile measurement unit 18 (see FIG. 1) is not necessary here.

The pressure sensor 16 may detect a pressure P inside the laser chamber 10 and outputs the pressure P to the laser control unit 30.

The laser gas supply device 23 may include a valve (not illustrated) and a flow controlling valve (not illustrated). The laser gas supply device 23 may be connected between the laser chamber 10 and a gas cylinder (not illustrated). In accordance with a control signal from the laser control unit 30, the laser gas supply device 23 may control the flow rate of a laser gas to be supplied from the gas cylinder to the laser chamber 10.

The laser gas exhaust device 24 may include a valve (not illustrated) and an exhaust pump (not illustrated). The laser gas exhaust device 24 may exhaust a part of the gas inside the laser chamber 10 in accordance with a control signal from the laser control unit 30.

In other respects, the fourth embodiment may be identical in configuration to the first embodiment described with reference to FIG. 1.

6.2 Control of Pulse Energy by Charging Voltage

Figure 31:
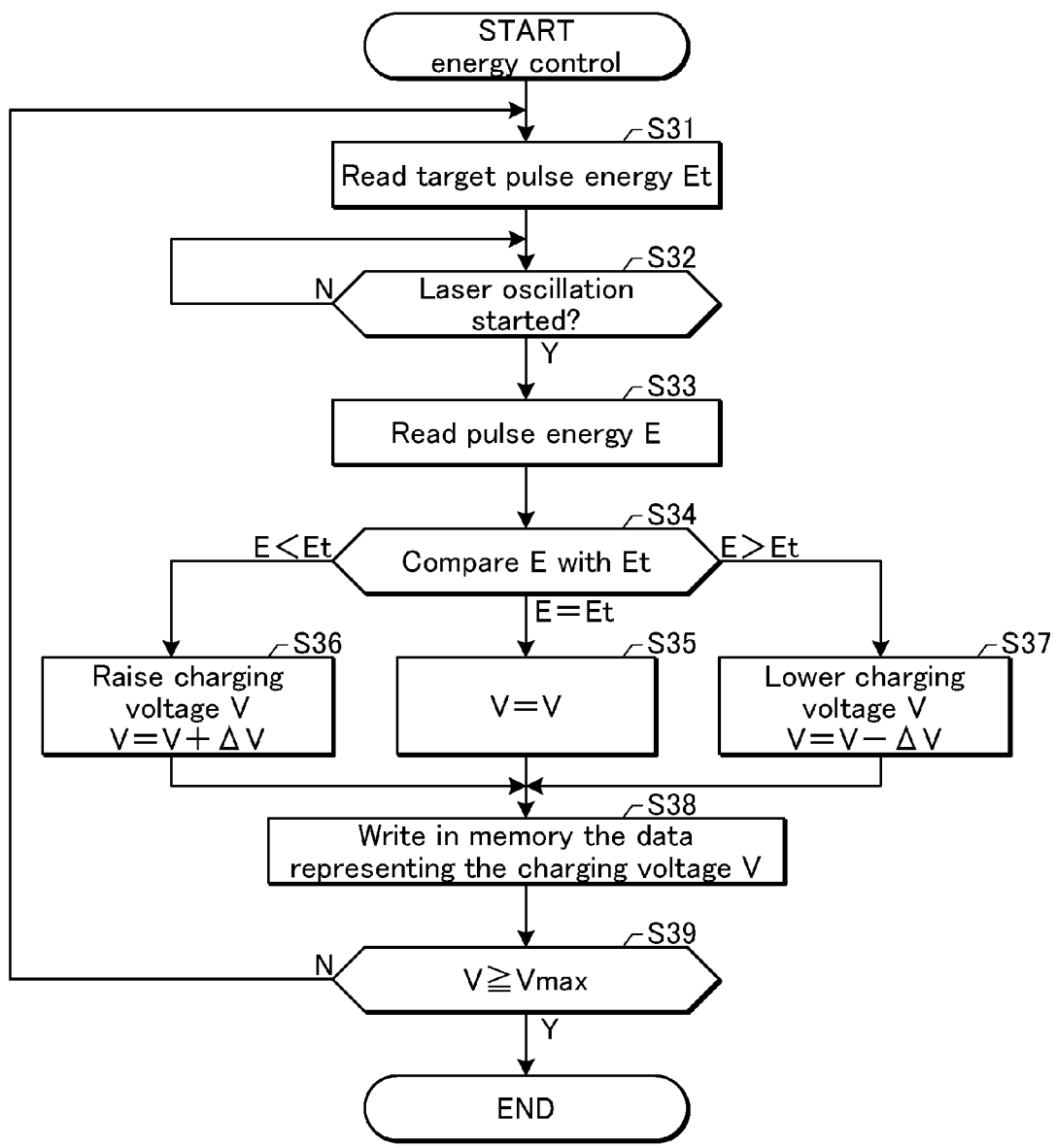
FIG. 31 is a flowchart for controlling pulse energy of a laser beam according to the fourth embodiment.

FIG. 31 is a flowchart for controlling pulse energy of a laser beam according to the fourth embodiment. The process shown in FIG. 31 may be performed by the laser control unit 30 (FIG. 30) independently of the control of the rotating speed of the fan described below with reference to FIG. 33. In the process shown in FIG. 31, the charging voltage V of the charger 12 may be controlled on the basis of data obtained from the pulse energy measurement unit 17, in order to hold the pulse energy of the laser beam at a desired value. Although the process shown in FIG. 31 is performed separately from the control of the rotating speed of the fan shown in FIG. 33, it is described below, as it can be a prerequisite for the control of the rotating speed of the fan.

First, the laser control unit 30 may read the value of a target pulse energy Et of the laser beam (S31). The value of the target pulse energy Et may, for example, be a value that is required by the exposure device control unit 110.

Next, the laser control unit 30 may determine whether laser oscillation has been started (S32). The determination as to whether laser oscillation has been started may be made on the basis of whether the laser control unit 30 has sent various signals for laser oscillation to the charger 12 and the pulse power module 13. Alternatively, the determination as to whether laser oscillation has been started may be made on the basis of whether the laser control unit 30 has received, from the pulse energy measurement unit 17, data representing a pulse energy E.

In a case where laser oscillation has not been started (S32; NO), the laser control unit 30 may repeat the determination until laser oscillation is started. In a case where laser oscillation has been started (S32; YES), the laser control unit 30 may proceed to S33.

In S33, the laser control unit 30 may read the value of the pulse energy E of the laser beam. The value of the pulse energy E may be a value received from the pulse energy measurement unit 17.

Next, the laser control unit 30 may compare the value of the pulse energy E of the laser beam with the value of the target pulse energy Et (S34).

In a case where the value of the pulse energy E is equal to the value of the target pulse energy Et (E=Et), the laser control unit 30 may hold the charging voltage V of the charger 12 at the current value V (S35: V=V).

However, in a case where the value of the pulse energy E is less than the value of the target pulse energy Et (E<Et), the laser control unit 30 may raise the charging voltage V of the charger 12 to a value obtained by adding a predetermined change amount $\Delta V$ to the current value V (S36: V=V+$\Delta V$). This makes it possible to raise the pulse energy E and bring it closer to the target pulse energy Et.

Meanwhile, in a case where the value of the pulse energy E is greater than the value of the target pulse energy Et (E>Et), the laser control unit 30 may lower the charging voltage V of the charger 12 to a value obtained by subtracting the predetermined change amount $\Delta V$ from the current value V (S37: V=V−$\Delta V$). This makes it possible to lower the pulse energy E and bring it closer to the target pulse energy Et.

When the control of the charging voltage V (one of S35 through S37) has ended, the laser control unit 30 may write, in the after-mentioned memory, the data representing the charging voltage V (S38).

Next, the laser control unit 30 may determine whether the charging voltage V is equal to or greater than a threshold Vmax (S39). In a case where the charging voltage V is equal to or greater than the threshold Vmax (S39; YES), laser beam emission efficiency is poor and it is necessary to stop the laser oscillation and perform maintenance, and thus the process according to this flowchart may be ended. However, in a case where the charging voltage V is not equal to or greater than the threshold Vmax (S39; NO), the process may return to the aforementioned S31, where the pulse energy E may be stabilized by continuously controlling the charging voltage V and the data representing the charging voltage V may be written in the after-mentioned memory.

6.3 Control of Gas Pressure

Figure 32:
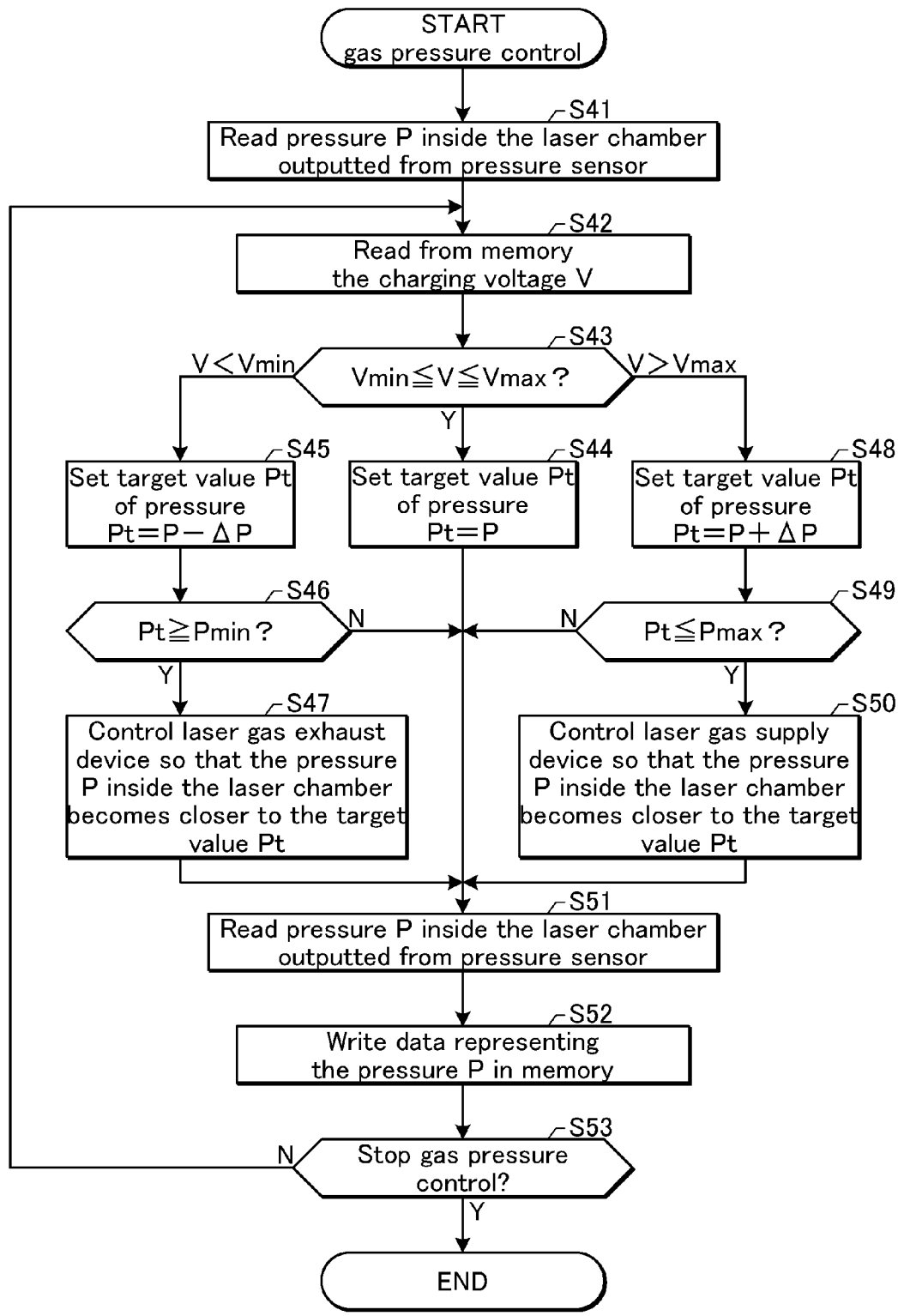
FIG. 32 is a flowchart for controlling a pressure inside a laser chamber according to the fourth embodiment.

FIG. 32 is a flowchart for controlling a pressure inside the laser chamber 10 according to the fourth embodiment. The process shown in FIG. 32 may be performed by the laser control unit 30 (FIG. 30) independently of the control of the rotating speed of the fan described below with reference to FIG. 33. In the process shown in FIG. 32, the pressure P inside the laser chamber may be controlled on the basis of the charging voltage V of the charger 12. Although the process shown in FIG. 32 is performed separately from the control of the rotating speed of the fan shown in FIG. 33, it is described below, as it can be a prerequisite for the control of the rotating speed of the fan.

First, the laser control unit 30 may read data representing the pressure P inside the laser chamber 10 (S41). The data representing the pressure P may be the one outputted from the pressure sensor 16.

Next, the laser control unit 30 may read the charging voltage V of the charger 12 (S42). The charging voltage V may be the one written in the after-mentioned memory in the aforementioned S38 (FIG. 31).

Next, the laser control unit 30 may compare the charging voltage V of the charger 12 with a first threshold Vain and a second threshold Vmax (S43). In a case where the charging voltage V of the charger 12 is equal to or greater than the first threshold Vain and equal to or less than the second threshold Vmax (S43; YES), the laser control unit 30 may hold a target value Pt of pressure at the current value P (S44). After S44, the laser control unit 30 may proceed to S51.

In a case where the charging voltage V of the charger 12 is less than the first threshold Vmin (S43; V<Vain), the laser control unit 30 may set, as the target value Pt of pressure, a value obtained by subtracting a predetermined value $\Delta P$ from the current value P (S45). Next, the laser control unit 30 may compare the target value Pt of pressure thus set with a threshold Pain (S46).

In a case where the target value Pt of pressure thus set is equal to or greater than the threshold Pain (S46; YES), the laser control unit 30 may proceed to S47. In S47, the laser control unit 30 may control the laser gas exhaust device 24 so that the pressure P inside the laser chamber 10 becomes closer to the target value Pt. After S47, the laser control unit 30 may proceed to S51.

In a case where the target value Pt of pressure thus set is less than the threshold Pmin (S46; NO), the laser control unit 30 may proceed to S51 without controlling the laser gas exhaust device 24.

In a case where the charging voltage V of the charger 12 exceeds the second threshold Vmax (S43; V>Vmax), the laser control unit 30 may set, as the target value Pt of pressure, a value obtained by adding the predetermined value ΔP to the current value P (S48). Next, the laser control unit 30 may compare the target value Pt of pressure thus set with a threshold Pmax (S49).

In a case where the target value Pt of pressure thus set is equal to or less than the threshold Pmax (S49; YES), the laser control unit 30 may proceed to S50. In S50, the laser control unit 30 may control the laser gas supply device 23 so that the pressure P inside the laser chamber 10 becomes closer to the target value Pt. After S50, the laser control unit 30 may proceed to S51.

In a case where the target value Pt of pressure thus set exceeds the threshold Pmax (S49; NO), the laser control unit 30 may proceed to S51 without controlling the laser gas supply device 23.

In S51, the laser control unit 30 may read the pressure P inside the laser chamber 10 again.

Next, the laser control unit 30 may write, in the aftermentioned memory, data representing the pressure P (S52).

Next, the laser control unit 30 may determine whether to stop the control of the gas pressure (S53). For example, upon receiving a laser beam output stop signal from the exposure device control unit 110, the laser control unit 30 may determine to stop the control of the gas pressure. In a case where the control of the gas pressure is stopped (S53; YES), the laser control unit 30 may end the process according to this flowchart. In a case where the control of the gas pressure is not stopped (S53; NO), the laser control unit 30 may return to the aforementioned S42 and repeat the subsequent processes.

As described above, in a case where the charging voltage V of the charger 12 is equal to or greater than the first threshold Vmin and equal to or less than the second threshold Vmax, the supply or exhaust of the laser gas by the process shown in FIG. 32 does not need to be performed.

In a case where the charging voltage V of the charger 12 has become less than the first threshold Vin, a part of the laser gas may be exhausted by the process shown in FIG. 32. The exhaust of a part of the laser gas may lower the pressure P inside the laser chamber 10. Since a decrease in the pressure P inside the laser chamber 10 leads to a reduction in output from the excimer laser apparatus, the charging voltage V may be raised by the process shown in FIG. 31 so that the output from the excimer laser apparatus may be stabilized.

By thus lowering the pressure P inside the laser chamber 10, an excessive decrease in the voltage that is supplied between the pair of electrodes 11a and 11b may be suppressed.

In a case where the charging voltage V of the charger 12 exceeds the second threshold Vmax, the laser gas may be supplied by the process shown in FIG. 32. The supply of the laser gas may raise the pressure P inside the laser chamber 10. Since an increase in the pressure P inside the laser chamber 10 leads to an increase in output from the excimer laser apparatus, the charging voltage V may be lowered by the process shown in FIG. 31 so that the output from the excimer laser apparatus may be stabilized.

By thus raising the pressure P inside the laser chamber 10, an excessive increase in the voltage that is supplied between the pair of electrodes 11a and 11b may be suppressed.

However, even in a case where the charging voltage V of the charger 12 exceeds the second threshold Vmax and the laser gas is supplied, the increase in output from the excimer laser apparatus may be restricted in a state where the pair of electrodes 11a and 11b have worn out. As a result, the pressure P inside the laser chamber 10 is more likely to rise in a state where the pair of electrodes 11a and 11b have worn out than in a case where the pair of electrodes 11a and 11b are new.

6.4 Tenth Example of Control

Figure 33:
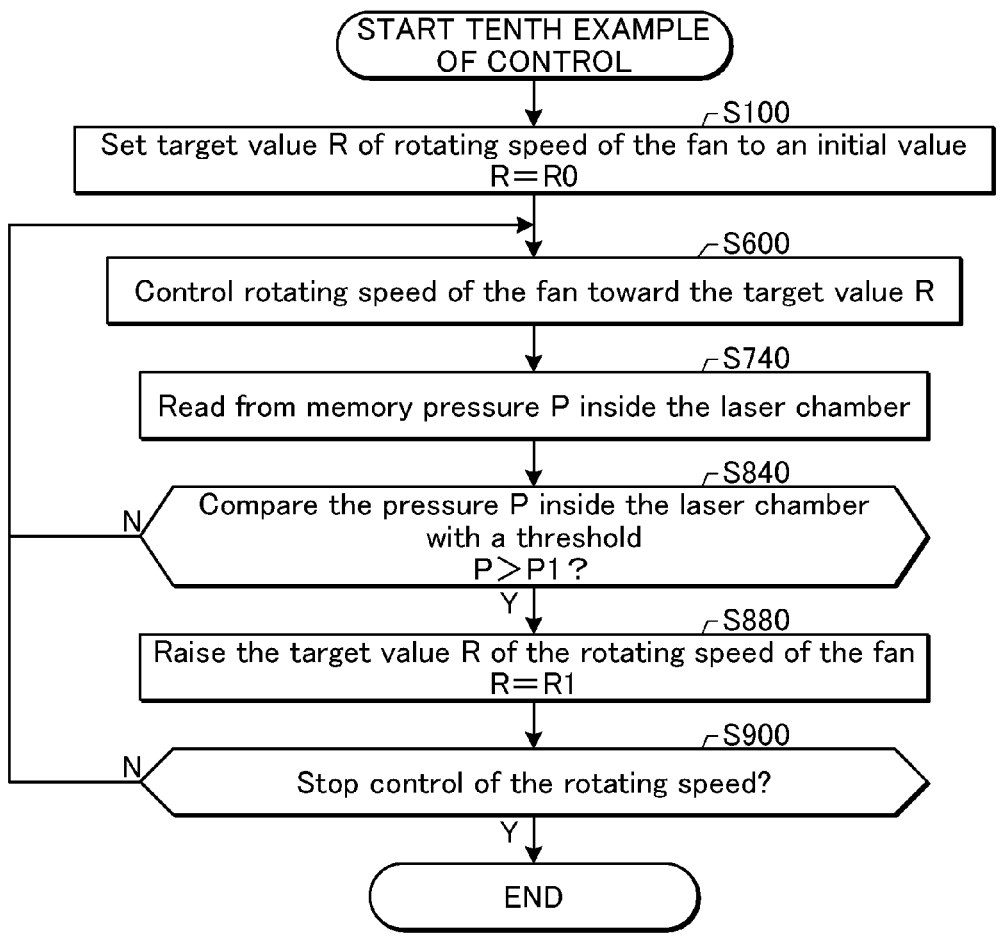
FIG. 33 is a flowchart illustrating a tenth example of controlling the rotating speed of the fan according to the present disclosure.

FIG. 33 is a flowchart illustrating a tenth example of controlling the rotating speed of the fan according to the present disclosure. The process shown in FIG. 33 may be performed by the laser control unit 30 (FIG. 30) in the excimer laser apparatus according to the fourth embodiment.

The tenth example of control may differ from the first example of control shown in FIG. 3 in terms of increasing the rotating speed of the fan when the pressure P inside the laser chamber 10 exceeds a threshold P1 (S740, S840, S880). The process for calculating the electrode gap G or calculating the target value R of the rotating speed of the fan from the electrode gap G (S400, S500) shown in FIG. 3 is not necessary here.

First, the laser control unit 30 may set the target value R of the rotating speed of the fan to an initial value R0 (S100). The initial value R0 may be such a rotating speed that the discharge is stable until the pressure P inside the laser chamber 10 reaches the threshold P1 but the discharge may become unstable as the wearing out of the pair of electrodes 11a and 11b progresses.

Next, the laser control unit 30 may send a rotating speed control signal to the rotating speed control unit 31 so that the rotating speed of the fan becomes closer to the target value R (S600). This process may be identical to the process of S600 described with reference to FIG. 3.

Next, the laser control unit 30 may read, from the aftermentioned memory, the data representing the pressure P inside the chamber 10 (S740).

Next, the laser control unit 30 may compare the pressure P inside the laser chamber 10 with the threshold P1 (S840). In a case where the pressure P inside the laser chamber 10 is equal to or less than the threshold P1 (S840; NO), the laser control unit 30 may return to S600. In a case where the pressure P inside the laser chamber 10 exceeds the threshold P1 (S840; YES), the laser control unit 30 may proceed to S880.

In S880, the laser control unit 30 may change the target value R of the rotating speed of the fan from the initial value R0 to R1. R1 may be a value that is greater than the initial value R0. R1 may be such a rotating speed that the discharge may be stable until the pressure P inside the laser chamber 10 reaches Pmax (see FIG. 34). Pmax may be a value that is greater than the threshold P1.

Next, the laser control unit 30 may determine whether to stop the control of the rotating speed (S900). This process may be identical to the process of S900 described with reference to FIG. 3. However, in a case where the control of the rotating speed is not stopped (S900; NO), the laser control unit 30 may return to the aforementioned S600 and repeat the subsequent processes.

Figure 34:
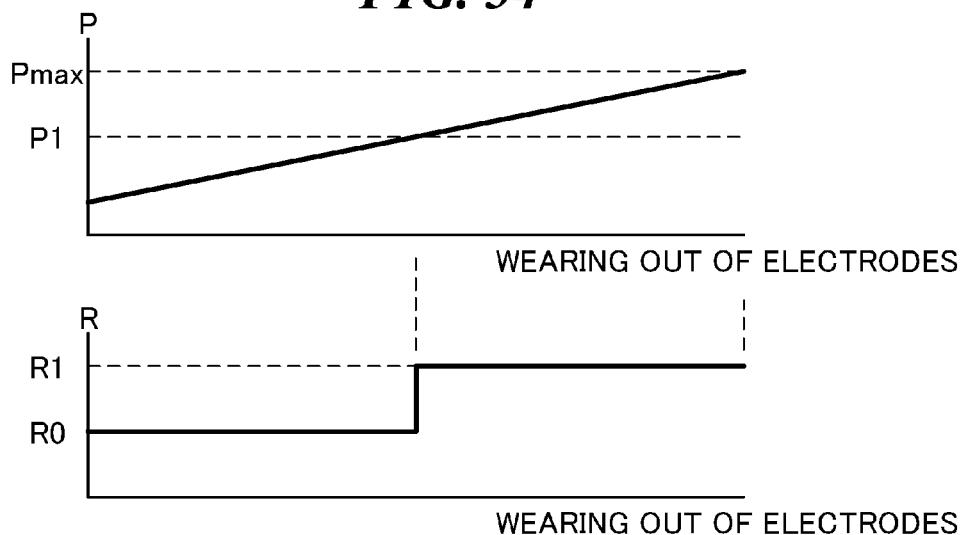
FIG. 34 is a graph illustrating a change in pressure inside a laser chamber caused by wearing out of a pair of electrodes and an example of setting of a target value of the rotating speed of the fan according to the wearing out of the pair of electrodes.

FIG. 34 is a graph illustrating a change in the pressure P inside the laser chamber 10 caused by wearing out of the pair of electrodes 11a and 11b and an example of setting of the target value R of the rotating speed of the fan according to the wearing out of the pair of electrodes. As mentioned above, the pressure P inside the laser chamber 10 may rise as the pair of electrodes 11a and 11b wear out. The target value R of the rotating speed of the fan may be set to the initial value R0 while the pressure P inside the laser chamber 10 is equal to or less than the threshold P1, and may be set to R1 once the pressure P inside the laser chamber 10 exceeds the threshold P1.

Although the tenth example of control has described a case where the target value R of the rotating speed of the fan is controlled in two stages, it may alternatively be controlled in three or more stages.

7. Regarding the Influence of Acoustic Waves

Figure 35:
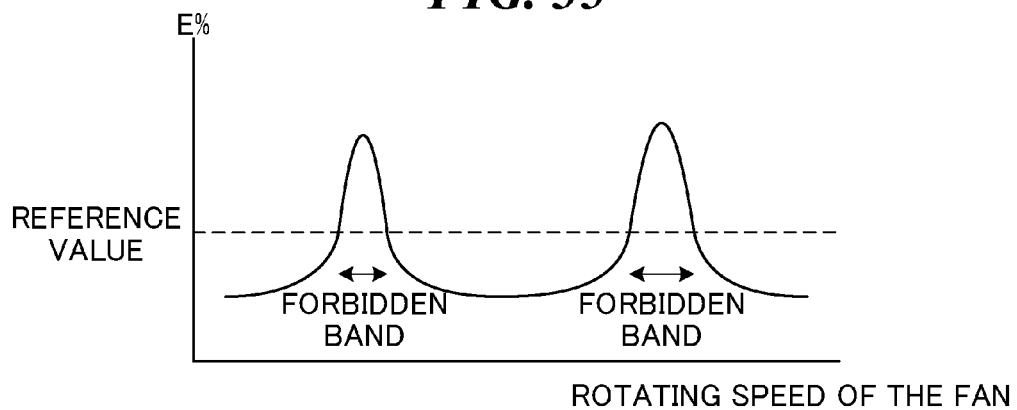
FIG. 35 schematically illustrates a relationship between the rotating speed of the fan in the excimer laser apparatus and the stability of pulse energy of a laser beam.

FIG. 35 schematically illustrates a relationship between the rotating speed of the fan in the excimer laser apparatus and the stability E % of pulse energy of the laser beam. In FIG. 35, it may be assumed that there is no change in wear-out amount of the pair of electrodes 11a and 11b.

In each of the excimer laser apparatuses according to the embodiments described above, acoustic waves generated by the discharge may be reflected by blades of the cross flow fan 21 while the fan is rotating, and may return to the discharge region. When the acoustic waves return to the discharge region, the gas density of the laser gas in the discharge region may fluctuate, and this fluctuation may influence the stability of the discharge. The influence of the acoustic waves on the stability of the discharge may depend on a relationship between the repetition frequency of the discharge and the rotating speed of the fan. As shown in FIG. 35, assuming that the repetition frequency of the discharge is constant, the stability E % of pulse energy of the laser beam may become extremely worse when the rotating speed of the fan comes close to a particular value.

Therefore, in each of the embodiments described above, a forbidden band of the rotating speed of the fan with respect to the repetition frequency of the discharge may be stored in advance in the after-mentioned memory. For example, a range of the rotating speed of the fan in which the stability E % of pulse energy of the laser beam may become worse than a predetermined reference value may be obtained in advance for each repetition frequency of the discharge to serve as a forbidden band.

Moreover, in the control of the rotating speed of the fan, the target value R of the rotating speed of the fan may be determined so as not to fall within a forbidden band. For example, each of the embodiments described above may further include a process for determining whether the target value R of the rotating speed of the fan thus calculated falls within a forbidden band. In a case where the target value R of the rotating speed of the fan thus calculated falls within a forbidden band, a new target value may be determined by adding a constant value to the target value R of the rotating speed of the fan thus calculated.

8. Configuration of Controller

Figure 36:
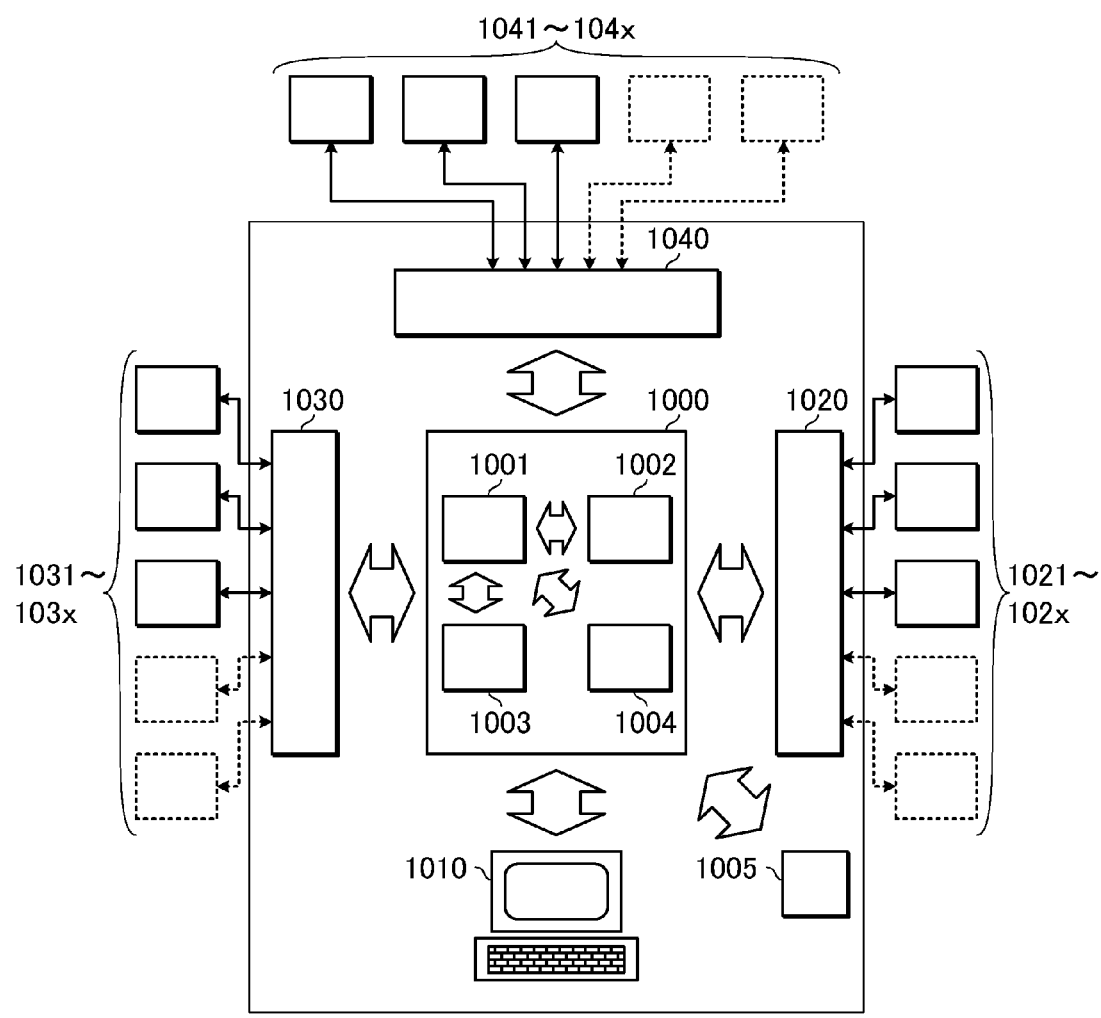
FIG. 36 is a block diagram schematically illustrating an exemplary configuration of a controller.

FIG. 36 is a block diagram schematically illustrating an exemplary configuration of a controller.

A controller such as the laser control unit 30 in the above-described embodiments may be constituted by a general-purpose control device such as a computer or a programmable controller. For example, the controller may be constituted as described below.

(Configuration)

The controller may include a processing unit 1000, a storage memory 1005, a user interface 1010, a parallel input/output (I/O) controller 1020, a serial I/O controller 1030, and an analog-to-digital (A/D) and digital-to-analog (D/A) converter 1040 that are connected to the processing unit 1000. The processing unit 1000 may include a central processing unit (CPU) 1001, a memory 1002, a timer 1003, and a graphics processing unit (GPU) 1004 that are connected to the CPU 1001.

(Operation)

The processing unit 1000 may read out programs stored in the storage memory 1005. The processing unit 1000 may execute read-out programs, read out data from the storage memory 1005 in accordance with the execution of the programs, or store data in the storage memory 1005.

The parallel I/O controller 1020 may be connected to devices 1021 to 102x communicable through parallel I/O ports. The parallel I/O controller 1020 may control communication using digital signals through parallel I/O ports that is performed in the process where the processing unit 1000 executes programs.

The serial I/O controller 1030 may be connected to devices 1031 to 103x communicable through serial I/O ports. The serial I/O controller 1030 may control communication using digital signals through serial I/O ports that is performed in the process where the processing unit 1000 executes programs.

The A/D and D/A converter 1040 may be connected to devices 1041 to 104x communicable through analog ports. The A/D and D/A converter 1040 may control communication using analog signals through analog ports that is performed in the process where the processing unit 1000 executes programs.

The user interface 1010 may be configured to display progress of executing programs by the processing unit 1000 to an operator or to receive instructions by the operator to the processing unit 1000 to stop execution of the programs or to execute interruption processing.

The CPU 1001 of the processing unit 1000 may perform arithmetic processing of programs. In the process where the CPU 1001 executes programs, the memory 1002 may temporally store programs or temporally store data in the arithmetic process. The timer 1003 may measure time or elapsed time to output the time or the elapsed time to the CPU 1001 in accordance with the execution of the programs. When image data is input to the processing unit 1000, the GPU 1004 may process the image data in accordance with the execution of the programs and output the results to the CPU 1001.

The devices 1021 to 102x communicable through parallel I/O ports, which are connected to the parallel I/O controller 1020, may be the exposure device control unit 110, another controller, or the like.

The devices 1031 to 103x communicable through serial I/O ports, which are connected to the serial I/O controller 1030, may be the charger 12, the pulse power module 13, the rotating speed control unit 31, or the like.

The devices 1041 to 104x communicable through analog ports, which are connected to the A/D and D/A converter 1040, may be various types of sensors such as the pressure sensor 16, the pulse energy measurement unit 17, the beam profile measurement unit 18, or the like.

With the above-described configuration, the controller may be capable of achieving the operation illustrated in the embodiments.

The aforementioned descriptions are intended to be taken only as examples, and are not to be seen as limiting in any way. Accordingly, it will be clear to those skilled in the art that variations on the embodiments of the present disclosure can be made without departing from the scope of the appended claims.

The terms used in the present specification and in the entirety of the scope of the appended claims are to be interpreted as not being limiting. For example, wording such as "includes" or "is included" should be interpreted as not being limited to the item that is described as being included. Furthermore, "has" should be interpreted as not being limited to the item that is described as being had. Furthermore, the modifier "a" or "an" as used in the present specification and the scope of the appended claims should be interpreted as meaning "at least one" or "one or more".

The invention claimed is:

1. A gas laser apparatus comprising:
a chamber containing a laser gas;
a pair of electrodes disposed within the chamber;
a fan disposed within the chamber;
a motor connected to a rotating shaft of the fan; and
a rotating speed control unit configured to control a rotating speed of the fan based on a wear-out parameter of the pair of electrodes to increase the rotating speed as the pair of electrodes wear out.

2. The gas laser apparatus according to claim 1, further comprising an electrode moving mechanism configured to move a first one of the pair of electrodes toward a second one of the pair of electrodes,
wherein the rotating speed control unit controls the rotating speed of the fan based on the wear-out parameter of the pair of electrodes and an amount of movement of the first one of the pair of electrodes by the electrode moving mechanism.

3. The gas laser apparatus according to claim 1, further comprising a distance measurement unit configured to measure a distance between the pair of electrodes,
wherein the wear-out parameter includes the distance between the pair of electrodes, and
a degree of wearing out of the pair of electrodes is determined by the distance between the pair of electrodes.

4. The gas laser apparatus according to claim 1, wherein the wear-out parameter includes a total number indicating how many pulses of a pulse voltage have been supplied between the pair of electrodes since the pair of electrodes were installed within the chamber, and
a degree of wearing out of the pair of electrodes is determined by the total number indicating how many pulses of a pulse voltage have been supplied.

5. The gas laser apparatus according to claim 1, wherein the wear-out parameter includes an integrated value of input energy having been inputted between the pair of electrodes since the pair of electrodes were installed within the chamber, and
a degree of wearing out of the pair of electrodes is determined by the integrated value of input energy.

6. The gas laser apparatus according to claim 1, wherein the wear-out parameter includes a stability of pulse energy of a laser beam that is outputted from the chamber, and
a degree of wearing out of the pair of electrodes is determined by the stability of pulse energy.

7. The gas laser apparatus according to claim 1, wherein the wear-out parameter includes a proximity with a target value of pulse energy of the laser beam that is outputted from the chamber, and
a degree of wearing out of the pair of electrodes is determined by the proximity with the target value.

8. The gas laser apparatus according to claim 1, wherein the wear-out parameter includes a pressure of the laser gas in the chamber, and
a degree of wearing out of the pair of electrodes is determined by the pressure of the laser gas in the chamber.

9. The gas laser apparatus according to claim 1, wherein the wear-out parameter includes a charging voltage of a charger configured to supply a pulse voltage between the pair of electrodes, and
a degree of wearing out of the pair of electrodes is determined by the charging voltage of the charger.

10. The gas laser apparatus according to claim 1, wherein the rotating speed control unit sets a target value of the rotating speed substantially proportional to the wear-out parameter.

11. The gas laser apparatus according to claim 1, wherein the wear-out parameter increases as the pair of electrodes wear-out, and
the rotating speed control unit sets a target value of the rotating speed calculated using a function whose derivative value becomes larger as the wear-out parameter becomes larger.

12. The gas laser apparatus according to claim 1, wherein the rotating speed control unit sets a first target value of the rotating speed when the wear-out parameter is in a first range and sets a second target value of the rotating speed greater than the first target value when the wear-out parameter is in a second range higher than the first range.

13. A gas laser apparatus comprising:
a chamber containing a laser gas;
a pair of electrodes disposed within the chamber;
a fan disposed within the chamber;
a motor connected to a rotating shaft of the fan;
an electrode moving mechanism configured to move a first one of the pair of electrodes toward a second one of the pair of electrodes; and
a rotating speed control unit configured to control a rotating speed of the fan based on a distance between the pair of electrodes calculated after the first one of the pair or electrodes is moved by the electrode moving mechanism to increase the rotating speed as the distance between the pair of electrodes increases.

14. A method for controlling a gas laser apparatus, the gas laser apparatus including a chamber containing a laser gas, a pair of electrodes disposed within the chamber, a fan disposed within the chamber, and a motor connected to a rotating shaft of the fan,
the method comprising:
calculating a distance between the pair of electrodes based on a wear-out parameter of the pair of electrodes; and
controlling a rotating speed of the fan based on the distance between the pair of electrodes to increase the rotating speed as the distance between the pair of electrodes increases.

* * * * *